United States Patent
Yamaguchi et al.

(10) Patent No.: US 7,635,622 B2
(45) Date of Patent: Dec. 22, 2009

(54) METHOD FOR MANUFACTURING A VERTICAL TRANSISTOR THAT INCLUDES A SUPER JUNCTION STRUCTURE

(75) Inventors: Hitoshi Yamaguchi, Nisshin (JP); Takeshi Miyajima, Anjo (JP)

(73) Assignee: DENSO CORPORATION, Kariya (JP)

( * ) Notice: Subject to any disclaimer, the term of this patent is extended or adjusted under 35 U.S.C. 154(b) by 142 days.

(21) Appl. No.: 11/889,075

(22) Filed: Aug. 9, 2007

(65) Prior Publication Data

US 2008/0038850 A1   Feb. 14, 2008

(30) Foreign Application Priority Data

Aug. 11, 2006   (JP) .............. 2006-219477

(51) Int. Cl.
*H01L 21/8238* (2006.01)
(52) U.S. Cl. ............ 438/212; 438/268; 438/430; 438/977; 257/E21.629; 257/E21.643
(58) Field of Classification Search ............ 438/269
See application file for complete search history.

(56) References Cited

U.S. PATENT DOCUMENTS

| | | | |
|---|---|---|---|
| 6,475,864 B1 | 11/2002 | Sato et al. | |
| 6,693,323 B2 | 2/2004 | Sato et al. | |
| 6,987,299 B2 * | 1/2006 | Disney et al. | ............ 257/327 |
| 7,075,149 B2 | 7/2006 | Sato et al. | |
| 7,364,994 B2 * | 4/2008 | Hshieh et al. | ............ 438/525 |
| 2005/0032291 A1 * | 2/2005 | Baliga | ............ 438/212 |
| 2005/0221547 A1 | 10/2005 | Yamauchi et al. | |
| 2008/0017897 A1 * | 1/2008 | Saito et al. | ............ 257/288 |
| 2008/0050876 A1 * | 2/2008 | Matocha et al. | ............ 438/269 |

FOREIGN PATENT DOCUMENTS

| | | |
|---|---|---|
| EP | 1-734-565 | 3/2005 |
| JP | A-2002-016250 | 1/2002 |
| JP | A-2003-303965 | 10/2003 |
| JP | A-2004-311673 | 11/2004 |
| JP | A-2005-317828 | 11/2005 |
| JP | A-2006-294968 | 10/2006 |
| JP | A-2007-13003 | 1/2007 |

* cited by examiner

*Primary Examiner*—Stephen W Smoot
(74) *Attorney, Agent, or Firm*—Posz Law Group, PLC

(57) ABSTRACT

A manufacturing method of a semiconductor device includes: forming multiple trenches on a semiconductor substrate; forming a second conductive type semiconductor film in each trench to provide a first column with the substrate between two trenches and a second column with the second conductive type semiconductor film in the trench, the first and second columns alternately repeated along with a predetermined direction; thinning a second side of the substrate; and increasing an impurity concentration in a thinned second side so that a first conductive type layer is provided. The impurity concentration of the first conductive type layer is higher than the first column. The first column provides a drift layer so that a vertical type first-conductive-type channel transistor is formed.

43 Claims, 9 Drawing Sheets

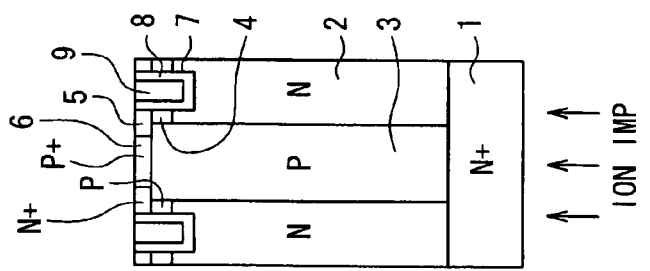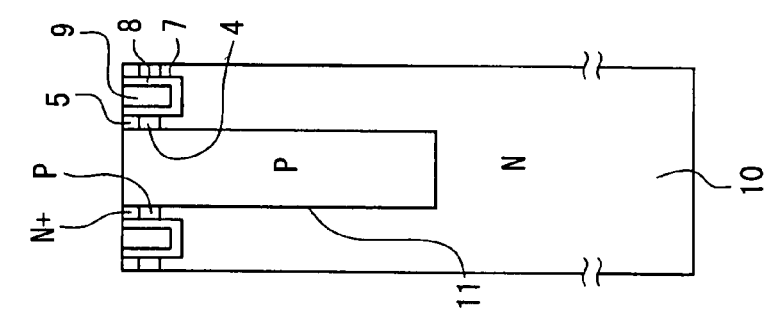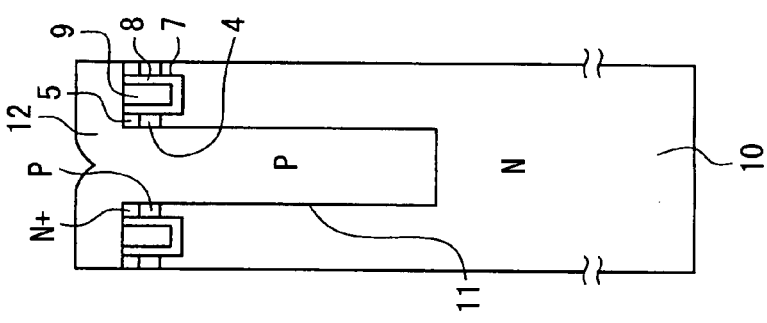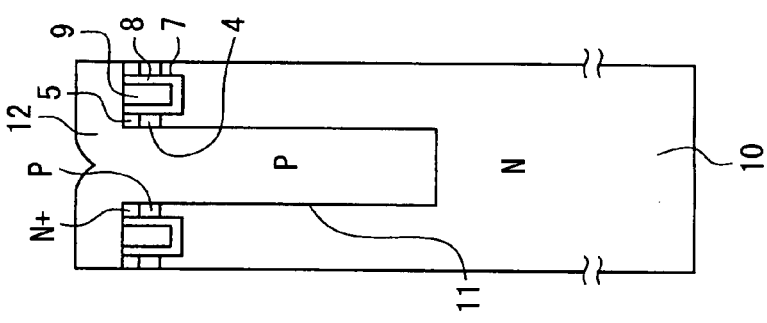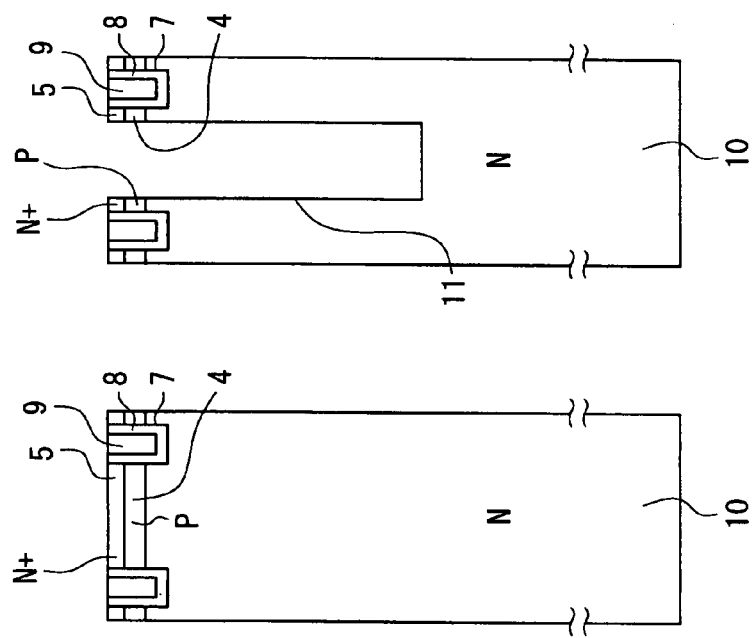

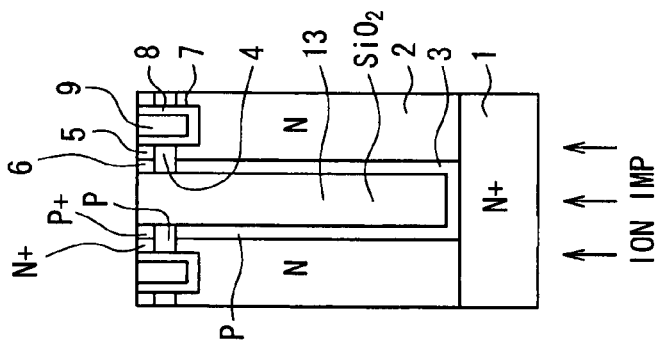

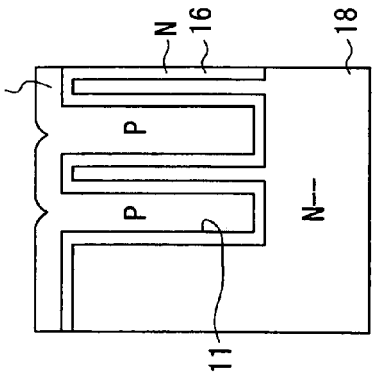
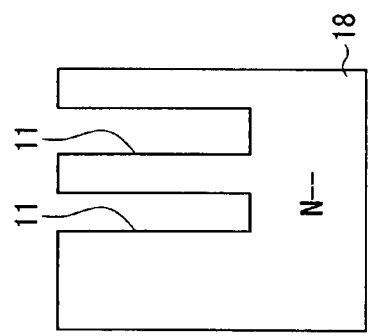
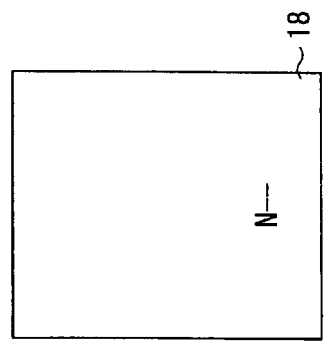
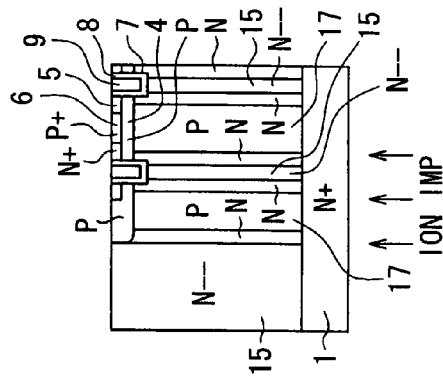
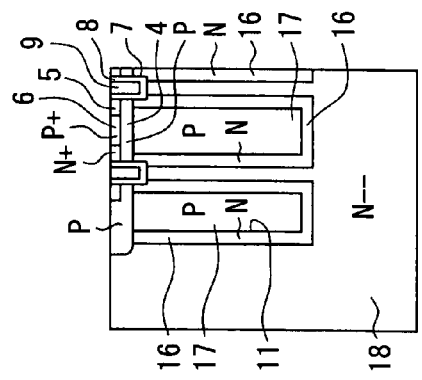
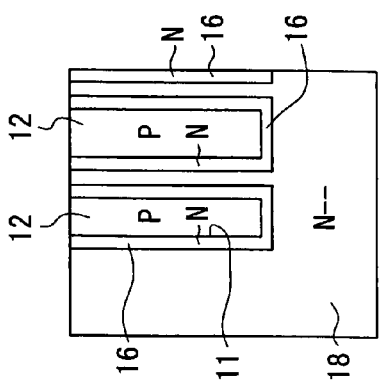

METHOD FOR MANUFACTURING A VERTICAL TRANSISTOR THAT INCLUDES A SUPER JUNCTION STRUCTURE

CROSS REFERENCE TO RELATED APPLICATION

This application is based on Japanese Patent Application No. 2006-219477 filed on Aug. 11, 2006, the disclosure of which is incorporated herein by reference.

FIELD OF THE INVENTION

The present invention relates to a method for manufacturing a semiconductor device.

BACKGROUND OF THE INVENTION

Heretofore, there has been known a semiconductor device in which a super-junction structure is adopted for, for example, a power MOS transistor of vertical type. The "super-junction structure" is a configuration in which N type layers and P type layers to serve as a drift region are alternately arranged in the planar direction of a substrate. Owing to the adoption of such a structure, an electric field from a source toward a drain is also directed from the N type layers to the P type layers. Accordingly, the electric field can be prevented from concentrating in one place between the source and the drain, and in turn, the prevention of insulation breakdown can be attained.

Besides, as the width "dn" of each N type layer and the width "dp" of each P type layer are smaller, the concentrations of the respective layers can be made higher, and the ON-resistance of the semiconductor device can be made lower. Further, as the thicknesses of the respective layers are larger, a higher withstand voltage can be realized.

A method for forming the semiconductor device having the super-junction structure as stated above has been proposed in, for example, Patent Document 1 (JP-A-2005-317905 corresponding to USP Application Publication No. 2005/221547) and Patent Document 2 (JP-A-2005-294711 corresponding to EP 1734565-A1). Concretely, Patent Documents 1 and 2 have proposed the method wherein an N+ type substrate on which an epitaxial layer of N type is formed is prepared, and after trenches are formed in the substrate, epitaxial layers of P type are buried into the trenches, and the front surface of the substrate is flattened and polished, thereby to form the repeated structure of P type regions and N type regions.

When it is intended to lower the ON-resistance of the semiconductor device and to heighten the withstand voltage thereof, in the case of adopting the super-junction structure for the MOS transistor as stated above, it is considered to make smaller the width dn of each N type layer and the width dp of each P type layer and to make the respective layers thicker, as described above. However, when it is intended to realize the lower ON-resistance and the higher withstand voltage, it has been revealed by the inventors that problems to be stated below are posed.

As the first problem, for the purpose of manufacturing a device portion of high withstand voltage, the epitaxial layer of the N type on the N+ type substrate needs to be thickened. By way of example, the thickness of the N type epitaxial layer needs to be at least 30 μm for a withstand voltage of 600 V, and it needs to be at least 60 μm for a withstand voltage of 1200 V. In order to obtain such a large thickness, film formation for a long time is required, and a process cost becomes high.

Besides, as the second problem, when both the high withstand voltage and the low ON-resistance are to be attained, the widths dn and dp of the respective epitaxial layers of the N type and P type need to be made small so as to heighten the concentrations of the respective layers, and the respective layers need to be thickened. However, when the trench is narrowed in order to make small the width of, for example, the P type epitaxial layer, the P type epitaxial layer formed earlier at the opening part of the trench closes up this opening part of the trench, to incur the problem that the P type epitaxial layer is not formed at the bottom of the trench. Thus, a cavity appears within the trench, and the interior of the trench is not completely filled up with the P type epitaxial layer. In this case, in order to prevent the cavity from appearing, it is considered to bury the epitaxial layer from the bottom part of the trench. However, a long time is expended on film formation, and a process cost becomes high.

Further, as the third problem, for the purpose of realizing the high withstand voltage, the balance of (concentration× thickness), i.e., charge balance, needs to be adjusted in each of the layers. That is, the value of (concentration×dp) in the P type epitaxial layer and the value of (concentration×dn) in the N type epitaxial layer must be brought into coincidence. However, in forming the P type epitaxial layer within the trench, impurity ions migrate from the N+ type substrate into the P type epitaxial layer being formed, on account of an outward diffusion, and the concentration of the P type epitaxial layer deviates from a target value. It is accordingly difficult to adjust the concentrations and thicknesses of the respective layers so as to satisfy the charge balance.

Thus, it is required to form epitaxial layers constituting a super-junction structure, in a short time, thereby to curtail a manufacturing cost. Further, it is required to make smaller the widths of epitaxial layers constituting a super-junction structure, thereby to attain the higher withstand voltage and lower ON-resistance of a semiconductor device. Furthermore, it is required to attain a charge balance in respective layers constituting a super-junction structure, for the purpose of ensuring a high withstand voltage.

SUMMARY OF THE INVENTION

In view of the above-described problem, it is an object of the present disclosure to provide a method for manufacturing a semiconductor device.

According to a first aspect of the present disclosure, a method for manufacturing a semiconductor device includes: forming a plurality of trenches on a first side of a semiconductor substrate, wherein the substrate has a first conductive type; forming a second conductive type semiconductor film in each trench so that the substrate between two adjacent trenches provides a first column, and the second conductive type semiconductor film in each trench provides a second column, wherein the first and second columns are alternately repeated along with a predetermined direction in parallel to the first side of the substrate; thinning a second side of the substrate, the second side being opposite to the first side; and increasing an impurity concentration of the first conductive type in a thinned second side of the substrate so that a first conductive type layer is provided. The impurity concentration of the first conductive type layer is higher than an impurity concentration of the first column. The first column provides a drift layer so that a vertical type first-conductive-type channel transistor is formed.

In the above method, since the substrate having the first conductive type provides the first column, it is not necessary to form the first column on a support substrate. Thus, a manufacturing time and a manufacturing cost are reduced. Further, since the step of increasing the impurity concentration of the first conductive type layer is performed after the step of forming the second conductive type semiconductor film in each trench, diffusion from the substrate to the second conductive type semiconductor film is reduced. Thus, the impurity concentration in the second conductive type semiconductor film is sufficiently controlled to be a predetermined value.

According to a second aspect of the present disclosure, a method for manufacturing a semiconductor device includes: forming a plurality of trenches on a first side of a semiconductor substrate, wherein the substrate has a first conductive type; forming a second conductive type semiconductor film in each trench so that the substrate between two trenches provides a first column, and the second conductive type semiconductor film in each trench provides a second column, wherein the first and second columns are alternately repeated along with a predetermined direction in parallel to the first side of the substrate; thinning a second side of the substrate, the second side being opposite to the first side; increasing an impurity concentration of a first part of a thinned second side of the substrate so that the first part provides a first conductive type layer; and reforming a second part of the thinned second side of the substrate so that the second part provides a second conductive type layer. The first part of the thinned second side is adjacent to the second part of the thinned second side. The impurity concentration of the first conductive type layer is higher than an impurity concentration of the first column. The impurity concentration of the second conductive type layer is higher than an impurity concentration of the second column. The first column on the first part of the thinned second side provides a drift layer so that a vertical type first-conductive-type channel transistor is formed. The second column on the second part of the thinned second side provides a drift layer so that a vertical type second-conductive-type channel transistor is formed.

In the above method, the vertical type first-conductive-type channel transistor and the vertical type second-conductive-type channel transistor are manufacturing by preparing the substrate having the first conductive type. Thus, it is not necessary to form the first column on a support substrate, so that a manufacturing time and a manufacturing cost are reduced. Further, diffusion from the substrate to the second conductive type semiconductor film is reduced. Thus, the impurity concentration in the second conductive type semiconductor film is sufficiently controlled to be a predetermined value.

According to a third aspect of the present disclosure, a method for manufacturing a semiconductor device includes: forming a plurality of trenches on a first side of a semiconductor substrate, wherein the substrate has a first conductive type; forming a second conductive type semiconductor film on an inner wall of each trench by an epitaxial growth method in such a manner that a thickness of the second conductive film is equal to or smaller than a half of a width of the trench; forming an oxide film on the second conductive type semiconductor film in each trench so that the trench is filled with the oxide film, wherein the substrate between two trenches provides a first column, and the second conductive type semiconductor film in each trench provides a second column, and wherein the first and second columns are alternately repeated along with a predetermined direction in parallel to the first side of the substrate; thinning a second side of the substrate, the second side being opposite to the first side; and increasing an impurity concentration of a thinned second side of the substrate so that a first conductive type layer is provided. An impurity concentration of the first conductive type layer is higher than an impurity concentration of the first column, and the first column provides a drift layer so that a vertical type first-conductive-type channel transistor is formed.

In the above method, the width of the second conductive type semiconductor film in each trench becomes smaller, so that an on-state resistance related to the second conductive type semiconductor film is reduced. Further, a manufacturing time and a manufacturing cost are reduced. Furthermore, the impurity concentration in the second conductive type semiconductor film is sufficiently controlled to be a predetermined value.

According to a fourth aspect of the present disclosure, a method for manufacturing a semiconductor device includes: forming a plurality of trenches on a first side of a semiconductor substrate, wherein the substrate has a first conductive type; forming a second conductive type semiconductor region on an inner wall of each trench by diffusing atoms in vapor phase or implanting ions into the inner wall of the trench; forming an oxide film on the second conductive type semiconductor region in each trench so that the trench is filled with the oxide film, wherein the substrate between two trenches provides a first column, and the second conductive type semiconductor region in each trench provides a second column, wherein the first and second columns are alternately repeated along with a predetermined direction in parallel to the first side of the substrate; thinning a second side of the substrate, the second side being opposite to the first side; and increasing an impurity concentration of a thinned second side of the substrate so that a first conductive type layer is provided. An impurity concentration of the first conductive type layer is higher than an impurity concentration of the first column, and the first column provides a drift layer so that a vertical type first-conductive-type channel transistor is formed.

In the above method, a manufacturing time and a manufacturing cost are reduced, and the impurity concentration in the second conductive type semiconductor region is sufficiently controlled to be a predetermined value.

According to a fifth aspect of the present disclosure, a method for manufacturing a semiconductor device includes: forming a plurality of trenches on a first side of a semiconductor substrate, wherein the substrate has a first conductive type; forming a first conductive type semiconductor region on an inner wall of each trench by diffusing atoms in vapor phase or implanting ions into the inner wall of the trench, wherein an impurity concentration of the first conductive type semiconductor region is higher than an impurity concentration of the substrate, and wherein the substrate between the first conductive type semiconductor region in adjacent two trenches and the first conductive type semiconductor region in the adjacent two trenches provide a first column; forming a second conductive type semiconductor film on the first conductive type semiconductor region in each trench so that the second conductive type semiconductor film in each trench provides a second column, wherein the first and second columns are alternately repeated along with a predetermined direction in parallel to the first side of the substrate; thinning a second side of the substrate, the second side being opposite to the first side; and increasing an impurity concentration of a thinned second side of the substrate so that a first conductive type layer is provided, wherein the impurity concentration of the first conductive type layer is higher than an impurity concentration of the first conductive type semiconductor region. A part of the substrate disposed on a periphery of the substrate provides a periphery layer, and the first column provides a drift layer so that a vertical type first-conductive-type channel transistor is formed.

In the above method, a manufacturing time and a manufacturing cost are reduced, and the impurity concentration in the second conductive type semiconductor film is sufficiently controlled to be a predetermined value. Further, the substrate provides the periphery layer as a terminal end of the device.

According to a sixth aspect of the present disclosure, a method for manufacturing a semiconductor device includes: forming a plurality of trenches on a first side of a semiconductor substrate, wherein the substrate has a first conductive type; forming a first conductive type semiconductor region on an inner wall of each trench by an epitaxial growth method, wherein an impurity concentration of the first conductive type semiconductor region is higher than an impurity concentration of the substrate, and wherein the substrate between adjacent two trenches and the first conductive type semiconductor region in the adjacent two trenches provide a first column; forming a second conductive type semiconductor film on the first conductive type semiconductor region in each trench so that the second conductive type semiconductor film in each trench provides a second column, wherein the first and second columns are alternately repeated along with a predetermined direction in parallel to the first side of the substrate; thinning a second side of the substrate, the second side being opposite to the first side; and increasing an impurity concentration of a thinned second side of the substrate so that a first conductive type layer is provided, wherein the impurity concentration of the first conductive type layer is higher than an impurity concentration of the first conductive type semiconductor region. A part of the substrate disposed on a periphery of the substrate provides a periphery layer, and the first column provides a drift layer so that a vertical type first-conductive-type channel transistor is formed. In the above method, the first conductive type semiconductor region is formed on the inner wall of each trench by the epitaxial growth method, and the second conductive type semiconductor film is formed on the first conductive type semiconductor region in each trench. Thus, the width of the first conductive type semiconductor region and the width of the second conductive type semiconductor film are reduced, respectively. Thus, the on-state resistance of the device is reduced. Further, a manufacturing time and a manufacturing cost are reduced, and the impurity concentration in the second conductive type semiconductor film is sufficiently controlled to be a predetermined value. Further, the substrate provides the periphery layer as a terminal end of the device.

According to a seventh aspect of the present disclosure, a method for manufacturing a semiconductor device includes: forming a plurality of trenches on a first side of a semiconductor substrate, wherein the substrate has a first conductive type; forming a first conductive type semiconductor region on an inner wall of each trench by diffusing atoms in vapor phase or implanting ions into the inner wall of the trench, wherein an impurity concentration of the first conductive type semiconductor region is higher than an impurity concentration of the substrate, and wherein the substrate between the first conductive type semiconductor region in adjacent two trenches and the first conductive type semiconductor region in the adjacent two trenches provide a first column; forming a second conductive type semiconductor film on the first conductive type semiconductor region in each trench by an epitaxial growth method; forming an oxide film on the second conductive type semiconductor film in each trench so that the trench is filled with the oxide film, wherein the second conductive type semiconductor film in each trench provides a second column, and wherein the first and second columns are alternately repeated along with a predetermined direction in parallel to the first side of the substrate; thinning a second side of the substrate, the second side being opposite to the first side; and increasing an impurity concentration of a thinned second side of the substrate so that a first conductive type layer is provided, wherein the impurity concentration of the first conductive type layer is higher than an impurity concentration of the first conductive type semiconductor region. A part of the substrate disposed on a periphery of the substrate provides a periphery layer. The first column provides a drift layer so that a vertical type first-conductive-type channel transistor is formed.

In the above method, a manufacturing time and a manufacturing cost are reduced, and the impurity concentration in the second conductive type semiconductor film is sufficiently controlled to be a predetermined value. Further, the substrate provides the periphery layer as a terminal end of the device.

BRIEF DESCRIPTION OF THE DRAWINGS

The above and other objects, features and advantages of the present invention will become more apparent from the following detailed description made with reference to the accompanying drawings. In the drawings:

FIGS. 4A to 4E are cross sectional views showing a method for manufacturing the device shown in FIG. 3;

FIGS. 6A to 6D are cross sectional views showing a method for manufacturing the device shown in FIG. 5;

FIGS. 9A to 9F are cross sectional views showing a method for manufacturing the device shown in FIG. 8;

DETAILED DESCRIPTION OF THE PREFERRED EMBODIMENTS

In the embodiments to be stated below, an "N type" (including an "N+ type" and an "N− type") corresponds to a first conductivity type, and a "P type" (including a "P+ type" and a "P− type") corresponds to a second conductivity type.

First Embodiment

Figure 1:
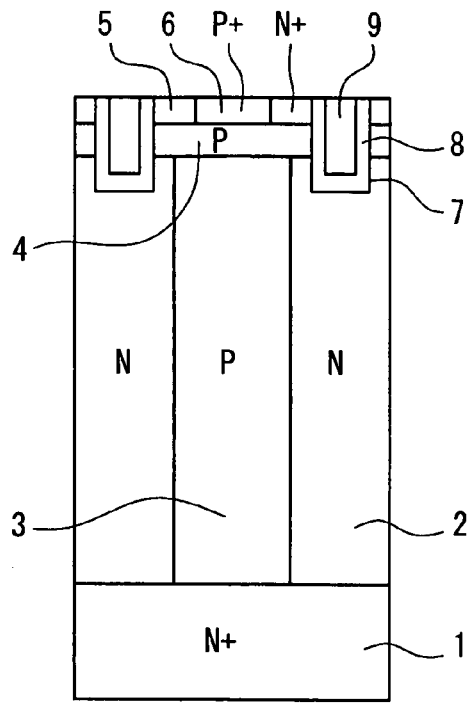
FIG. 1 is a cross sectional view showing a semiconductor device according to a first embodiment.

FIG. 1 is a schematic sectional view of a semiconductor device according to the first embodiment. As shown in FIG. 1, the semiconductor device is formed with a large number of MOS transistors of N-channel type. An N type layer 2 (corresponding to a first layer of first conductivity type) and a P type layer 3 (corresponding to a first layer of second conductivity type) are formed on an N+ type layer 1 (corresponding to a second layer of the first conductivity type) as drift regions, and a super-junction structure in which the N type layer 2 and P type layer 3 are alternately arranged in the planar direction of the N+ type layer 1 is formed.

Besides, a P type channel layer 4 is formed at the front surface layer parts of the N type layer 2 and the P type layer 3. Further, an N+ type source layer 5 is formed on a side opposing to the N type layer 2, within the front surface layer part of the P type channel layer 4, and a P+ type layer 6 is formed on a side opposing to the P type layer 3.

In addition, a trench 7 reaching the N type layer 2 is formed penetrating through the N+ type source layer 5 and the P type channel layer 4. A gate insulating film 8 and a gate layer 9 are successively formed on the inner wall surface of the trench 7, and a trench gate structure which consists of the trench 7, gate insulating film 8 and gate layer 9 is configured.

Incidentally, part of the N+ type source layer 5 and the trench gate structure are covered with an insulating film not shown. In addition, unshown electrodes which are electrically connected to the N+ type source layer 5 and the gate layer 9 are respectively formed. Besides, a drain electrode not shown is formed so as to lie in touch with the N+ type layer 1. The above is the whole configuration of the semiconductor device according to this embodiment.

Next, a method for manufacturing the semiconductor device will be described with reference to the drawings. FIGS. 2A to 2F are views showing manufacturing steps for the semiconductor device shown in FIG. 1.

Figure 2A:
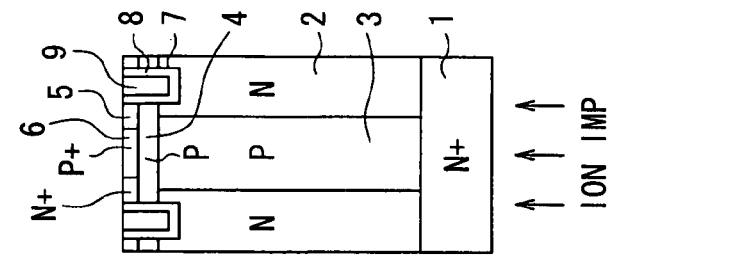
FIGS. 2A to 2F are cross sectional views showing a method for manufacturing the device shown in FIG. 1.

At the step shown in FIG. 2A, an N type substrate 10 (corresponding to a substrate of first conductivity type) is prepared. The N type substrate 10 is a silicon substrate which is doped with As (arsenic), Sb (antimony) or P (phosphorus) as an impurity in a doping quantity of, for example, $1\times10^{15}$ $cm^{-3}$ to $1\times10^{18}$ $cm^{-3}$. The reason why the lower limit of the doping quantity is set at $1\times10^{15}$ $cm^{-3}$ at this step, is that, at a lower impurity concentration, the doping becomes meaningless. Besides, the reason why the upper limit of the doping quantity is set at $1\times10^{18}$ $cm^{-3}$ is that, at a higher impurity concentration, any depletion layer is not formed. In addition, the impurity concentration of the N type substrate 10 doped with the impurity is measured by, for example, a method of resistivity measurement.

Figure 2B:
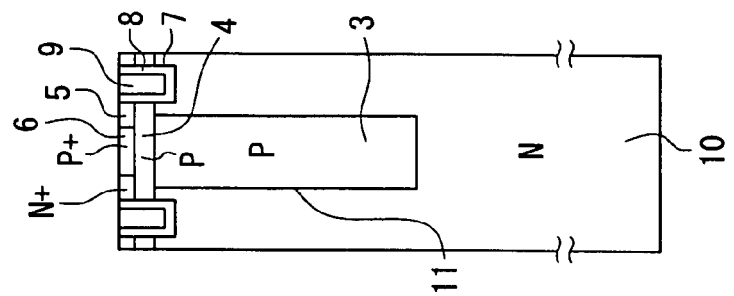

At the step shown in FIG. 2B, an oxide film not shown is formed on the front surface of the N type substrate 10 by a method of thermal oxidation or CVD, and the pattern of a part to become a trench 11 is formed by a photolithographic process and an etching process which are well known. In addition, the trench 11 having a depth of 10 μm to 100 μm and a width of 0.1 μm to 5 μm is formed by dry etching or wet etching as an etching process.

By the way, in a case where the trench 11 is formed in the N type substrate 10 by the wet etching, it is favorable for the execution of anisotropic etching to adopt a (110) substrate as the N type substrate 10, and to employ an alkaline etchant such as KOH (potassium hydroxide) or TMAH (tetramethyl ammonium hydroxide).

Figure 2C:
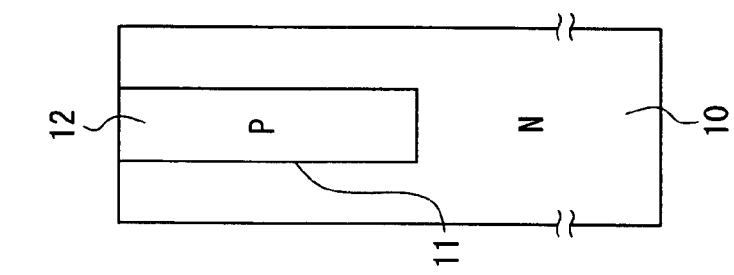

At the step shown in FIG. 2C, a CVD equipment is prepared, and the N type substrate 10 is set in the CVD equipment. Besides, a dopant gas of phosphine, arsine or antimony, and HCL gas for suppressing an epitaxial growth at the upper part of the trench 11, are caused to flow through a growth gas of silane, dichlorosilane or trichlorosilane. Thus, a P type epitaxial layer 12 is buried in the trench 11 of the N type substrate 10.

On this occasion, using the concentration of the N type substrate 10 measured at the step shown in FIG. 2A, the P type epitaxial layer 12 is formed while the concentration of this P type epitaxial layer 12 is being adjusted so that the product between the width of the P type epitaxial layer 12 (that is, the width of the trench 11) and the concentration thereof may become equal to the product between the width of the N type substrate 10 between the trenches 11 (that is, the width of a region to become an N type layer 2) and the concentration thereof. In this way, the charge balance between the N type substrate 10 (the region to be configured as the N type layer 2 by a later step) and the P type epitaxial layer 12 can be attained.

Further, in forming the P type epitaxial layer 12, this P type epitaxial layer 12 is buried into the trench 11 without lowering the temperature of the N type substrate 10 stepwise, that is, with the N type substrate 10 held at a constant temperature. Thus, the migrations of impurity ions from the N type substrate 10 into the P type epitaxial layer 12 can be suppressed, and in turn, an outward diffusion can be suppressed.

Figure 2D:
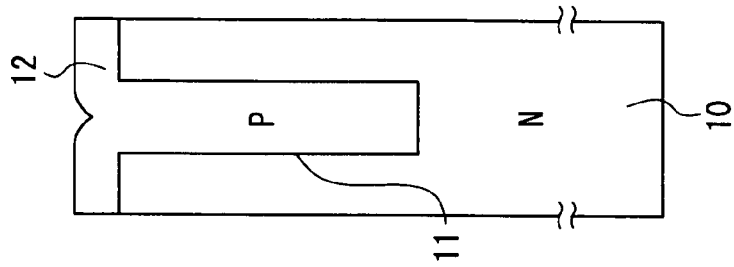

At the step shown in FIG. 2D, the front surface side of the N type substrate 10 is flattened in such a way that polishing based on CMP or etching-back based on dry etching is performed a thickness of about 1 μm from the front surface side of the N type substrate 10. Thus, the repeated parts of a P type region (the P type epitaxial layer 12) and an N type region (the N type substrate 10) are denuded on the front surface side of the N type substrate 10.

Figure 2E:
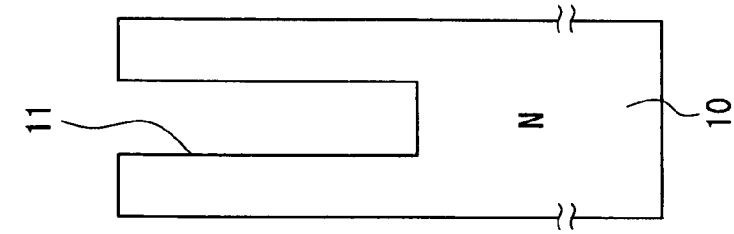

At the step shown in FIG. 2E, a semiconductor device portion is formed by well-known manufacturing processes. Concretely, a P type channel layer 4, an N+ source layer 5 and a P+ type layer 6 are formed by a photolithographic process, an ion implantation process and thermal diffusion/annealing processes. Besides, a trench gate structure is formed by a photolithographic process, a dry etching process, a thermal oxidation process and a poly-silicon film formation process. Further, electrodes, wiring lines and a protective film, not shown, are formed on the front surface side of the N type substrate 10 by a photolithographic process, an etching process, a metal film formation process and an insulating film formation process.

In this embodiment, the trench gate structure is formed on the N type substrate 10, whereby a MOS transistor of N channel type is formed. When the device portion has been thus formed, the P type epitaxial layer 12 within the trench 11 is configured as a P type layer 3 shown in FIG. 1.

Figure 2F:
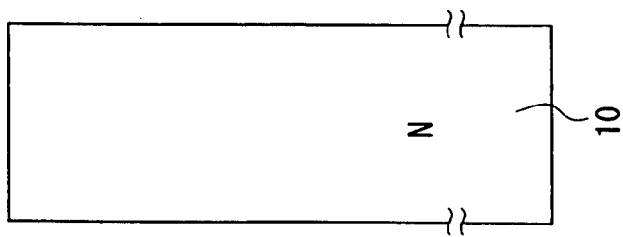

At the step shown in FIG. 2F, the N type substrate 10 is thinned to a thickness of 30 μm to 120 μm by cutting down the rear surface side of the N type substrate 10, and an N+ type layer 1 is formed by the ion implantation and diffusion of phosphorus. Thus, that region of the N type substrate 10 which is held between the P type layers 3 is configured as the N type layer 2. In addition, a drain electrode not shown is formed on the N+ type layer 1.

Thereafter, the substrate having ended the step shown in FIG. 2F is subjected to dicing cut, thereby to be split in the shape of a chip. Then, the semiconductor device shown in FIG. 1 is finished up.

As described above, this embodiment features that the N type layer 2 to constitute the super-junction structure is prepared as the N type substrate 10, that the super-junction structure is formed by employing the N type substrate 10, and that the N+ type layer 1 is lastly formed. In this manner, the epitaxial layer to become the N type layer 2 is not formed, but the substrate of N type is employed beforehand, whereby the formation of the epitaxial layer for forming the N type layer 2 can be dispensed with. Accordingly, the step of forming the N type layer 2 as the epitaxial layer can be removed, and the shortening of a manufacturing time period and the curtailment of a manufacturing cost can be realized.

As compared with the prior-art method in which the epitaxial layer of N type is formed on the substrate of N+ type, the method in which the N+ type layer 1 is formed by the ion implantation and the thermal diffusion as in this embodiment can reduce the number of steps and the attendant process cost and can lower the manufacturing cost.

Moreover, since the N type substrate 10 lower in concentration than the N+ type layer 1 is employed, the migrations of the impurity ions from the N type substrate 10 into the P type epitaxial layer 12 being formed, that is, the outward diffusion can be suppressed in the case where the P type epitaxial layer 12 is formed within the trench 11 at the step shown in FIG. 2C. Thus, the charge balance between the respective layers of the P type layer 3 and the N type layer 2 can be easily established, and in turn, a withstand voltage characteristic in the semiconductor device can be enhanced.

Second Embodiment

In this embodiment, only parts different from the parts of the first embodiment will be described. This embodiment features that, after a device portion has been formed on an N type substrate 10, a super-junction structure is formed.

Figure 3:
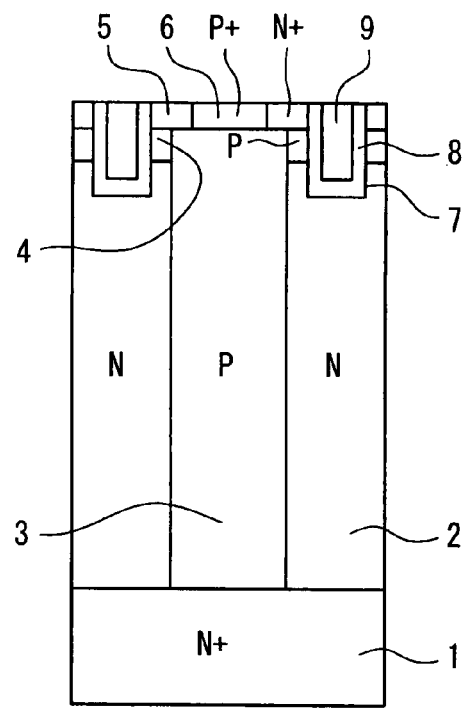
FIG. 3 is a cross sectional view showing a semiconductor device according to a second embodiment.

FIG. 3 is a schematic sectional view of a semiconductor device according to this embodiment. In this embodiment, any P type channel layer 4 is not existent in a P type layer 3, unlike in the semiconductor device shown in FIG. 1 in the first embodiment. More specifically, a P type channel layer 4 is formed at the front surface layer part of an N type layer 2, and an N+ type source layer 5 is formed at the front surface layer part of the P type channel layer 4. In addition, a trench 7 reaching the N type layer 2 is formed penetrating through the N+ type source layer 5 and the P type channel layer 4. A gate insulating film 8 and a gate layer 9 are successively formed on the inner wall surface of the trench 7, whereby a trench gate structure is configured. Besides, a P+ type layer 6 is formed at the front surface layer part of the P type layer 3. The above is the configuration of the semiconductor device according to this embodiment.

Next, a method for manufacturing the semiconductor device according to this embodiment will be described with reference to the drawings. FIGS. 4A to 4F are views showing manufacturing steps for the semiconductor device shown in FIG. 3.

In this embodiment, after the step shown in FIG. 2A has been first ended, the trench gate structure of a device portion is formed at the step shown in FIG. 4A. More specifically, a P type channel layer 4 and an N+ source layer 5 are formed by a photolithographic process, an ion implantation process and thermal diffusion/annealing processes. Further, the trench gate structure is formed by a photolithographic process, a dry etching process, a thermal oxidation process and a polysilicon film formation process.

In addition, at the step shown in FIG. 4B, an oxide film not shown is formed on the front surface side of an N type substrate 10 by thermal oxidation or CVD, and the pattern of a part to become a trench 11 is formed by a photolithographic process and an etching process. On this occasion, the oxide film is patterned so that the trenches 11 may be located between the trench gate structures of individual elements. Further, the trench 11 having a depth of 10 μm to 100 μm and a width of 0.1 μm to 5 μm is formed by dry etching or wet etching as an etching process.

At the step shown in FIG. 4C, a P type epitaxial layer 12 is buried into the trench 11 in the same way as at the step shown in FIG. 2C.

At the step shown in FIG. 4D, the front surface side of the N type substrate 10 is flattened in the same way as at the step shown in FIG. 2D. Further, the unshown electrodes, wiring lines and protective film of a MOS transistor are formed on the front surface side of the N type substrate 10 by a photolithographic process, an etching process, a metal film formation process and an insulating film formation process.

At the step shown in FIG. 4E, an N+ type layer 1 is formed in the same way as at the step shown in FIG. 2F. Besides, a P+ type layer 6 is formed at the front surface layer part of a P type layer 3. In the above way, the semiconductor device shown in FIG. 3 is finished up.

As described above, in this embodiment, the device portion is formed earlier, and the P type epitaxial layer 12 to become the P type layer 3 is formed. In this manner, the P type epitaxial layer 12 is formed after the formation of the device portion, so that a heat treatment concerning repeated P-N layers (that is, the repeated structure of the P type layer 3 and an N type layer 2) can be relieved. It is therefore possible to keep the concentrations of the P-N layers high and to make an ON-resistance still lower.

Third Embodiment

In this embodiment, only parts different from the parts of the foregoing embodiments will be described. This embodiment features that a P type layer 3 is not buried completely within a trench 11, but that in a state where a P type epitaxial layer 12 is formed on the wall surface of the trench 11, an insulating layer is buried into the P type epitaxial layer 12 conforming to the shape of the trench 11, thereby to configure a repeated structure which consists of an N type layer 2 and the P type layer 3 formed of the P type epitaxial layer 12.

Figure 5:
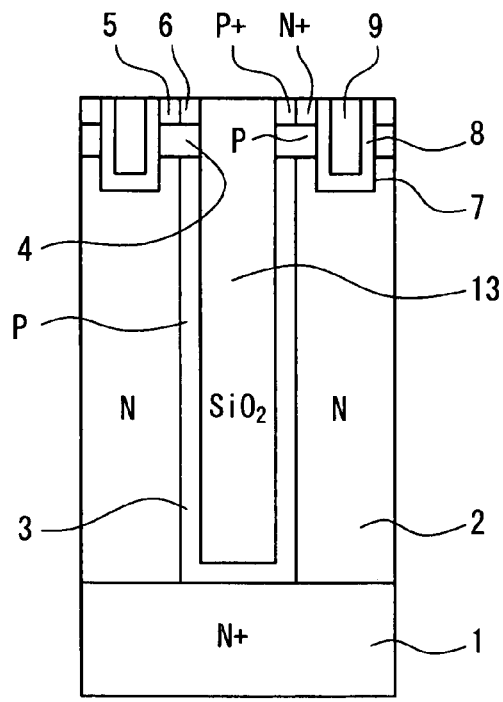
FIG. 5 is a cross sectional view showing a semiconductor device according to a third embodiment.

FIG. 5 is a schematic sectional view of a semiconductor device according to this embodiment. As shown in the figure, in this embodiment, an oxide film 13 and the P type layer 3 are successively formed on the inner wall surface of the trench 11 which is provided in each N type layer 2 formed with a trench gate structure. An $SiO_2$ film, for example, is adopted as the oxide film 13.

Next, a method for manufacturing the semiconductor device will be described with reference to the drawings. FIGS. 6A to 6D are views showing manufacturing steps for the semiconductor device shown in FIG. 5. First, the steps shown in FIGS. 2A and 2B are carried out to prepare an N type substrate 10 formed with a trench 11. Incidentally, also in this embodiment, the impurity concentration of the N type substrate 10 is measured beforehand.

In addition, at the step shown in FIG. 6A, a CVD equipment is prepared, and the N type substrate 10 formed with the trench 11 is set in the CVD equipment. Besides, a dopant gas of diborane is caused to flow through a growth gas of silane, dichlorosilane or trichlorosilane. Thus, a P type epitaxial layer 12 is formed on the wall surface of the trench 11 of the N type substrate 10. On this occasion, the P type epitaxial layer 12 is formed at a thickness of, at most, half of the width of the trench 11, on this trench 11. Thus, a width for burying an oxide film 13 can be ensured.

Besides, in forming the P type epitaxial layer 12, this P type epitaxial layer 12 is formed so that the impurity concentration of the P type epitaxial layer 12 may become higher than the impurity concentration of the N type substrate 10. In other words, the P type epitaxial layer 12 is formed so as to satisfy [(the width of the P type epitaxial layer 12)×(the impurity concentration of the P type epitaxial layer 12)>(the width of a part to become an N type layer 2, in the N type substrate 10)×(the impurity concentration of the N type substrate 10 measured at the above step)].

Further, the oxide film 13 is buried into the P type epitaxial layer 12 by employing the CVD equipment. Since the step of burying the oxide film 13 can be performed at a low temperature, the oxide film 13 can be easily formed on the P type epitaxial layer 12.

Thereafter, at the step shown in FIG. 6B, that part of the oxide film 13 which is formed on the P type epitaxial layer 12 on the front surface side of the N type substrate 10 is removed by dry etching, and the P type epitaxial layer 12 at the front surface of the N type substrate 10 is flattened by dry etching or polishing based on CMP.

At the step shown in FIG. 6C, a device portion is formed on the N type substrate 10 in the same way as at the step shown in FIG. 2E. When the device portion has been thus formed, the P type epitaxial layer 12 within the trench 11 is configured as a P type layer 3 shown in FIG. 5.

In forming the device portion at this step, a configuration up to a trench gate structure is formed. In addition, the withstand voltage of the device portion is measured. In this embodiment, the withstand voltage measurement is performed, for example, in such a way that probes are pushed against the electrode parts of the device portion, and that a voltage is applied between the source and drain of the device portion.

In a case where the value of the withstand voltage measured in this way is lower than a supposed value (reference value), the N+ type substrate is heat-treated, whereby the boron of the P type layer 3 is absorbed out into the oxide film 13 so as to lower the concentration of the P type layer 3, by utilizing the difference between the segregation coefficients of boron in the oxide film 13 and in silicon forming the N type substrate 10. Thus, a charge balance can be adjusted, and the withstand voltage of the device portion can be adjusted to a target value.

Accordingly, in order to facilitate the charge balance adjustment by absorbing out the impurity ions of the P type layer 3 into the oxide film 13 at this step, the impurity concentration of the P type epitaxial layer 12 should preferably be made somewhat high beforehand at the step shown in FIG. 6A.

Besides, after the charge balance has been adjusted, the unshown electrodes, wiring lines and protective film of the device portion are formed on the front surface side of the N type substrate 10 at this step. By the way, in a case where the target value has been obtained as the withstand voltage of the device portion by the withstand voltage measurement, the heat treatment need not be performed. Therefore, after the electrodes etc. of the device portion have been formed, the manufacturing method proceeds to the next step.

In addition, at the step shown in FIG. 6D, an N+ type layer 1 is formed in the same way as at the step shown in FIG. 2F. Thus, the semiconductor device shown in FIG. 5 is finished up.

As described above, this embodiment features that, in forming the P type epitaxial layer 12, this P type epitaxial layer 12 is formed at the thickness of, at most, half of the width of the trench 11. Thus, the width of the P type layer 3 can be made small, and the impurity concentration of the P type layer 3 can be consequently set higher than that of the N type substrate 10. Besides, since the width of the P type layer 3 can be made small, the ON-resistance of the device portion can be lowered.

Moreover, the P type epitaxial layer 12 is formed beforehand so as to have the impurity concentration higher than that of the N type substrate 10, whereby after the formation of the device portion, the impurity ions of the P type epitaxial layer 12 can be absorbed out into the oxide film 13 so as to adjust the charge balance. Thus, the withstand voltage of the device portion can be held at a high available percentage.

In this embodiment, in the same manner as in the foregoing embodiments, the N type substrate 10 is employed as the substrate for manufacturing the semiconductor device. As stated before, therefore, it is possible to relieve the manufacturing process of the epitaxial layer and to curtail the manufacturing cost of the semiconductor device.

Fourth Embodiment

In this embodiment, only parts different from the parts of the foregoing embodiments will be described. This embodiment features that, in manufacturing the semiconductor device shown in FIG. 5, a device portion is formed earlier, whereupon a super-junction structure is formed.

Figure 7A:
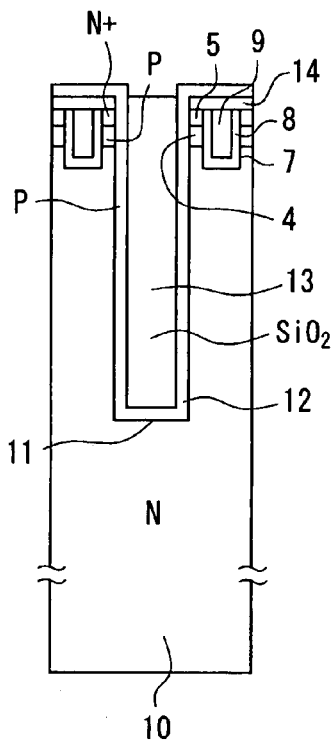
FIGS. 7A to 7C are cross sectional views showing a method for manufacturing a semiconductor device according to a fourth embodiment.
Figure 7B:
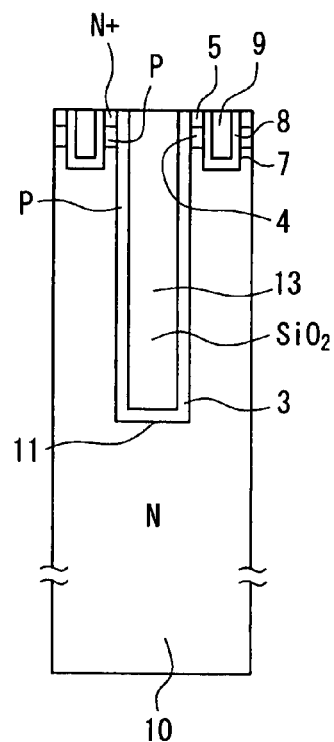
Figure 7C:
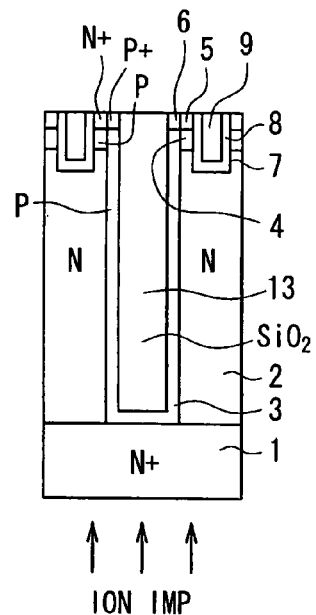

FIGS. 7A to 7C are views showing manufacturing steps for the semiconductor device shown in FIG. 5. First, the steps shown in FIG. 4B are carried out, thereby to prepare an N type substrate 10 which is formed with the device portion and provided with a trench 11. Incidentally, also in this embodiment, the impurity concentration of the N type substrate 10 is measured beforehand.

At the step shown in FIG. 7A, an oxide film 14 is formed at a part formed with the device portion, in the front surface side of the N type substrate 10 (at a part except the opening of the trench 11). Thereafter, a P type epitaxial layer 12 and an oxide film 13 are formed in the same way as at the step shown in FIG. 6A.

At the step shown in FIG. 7B, the oxide film 13, P type epitaxial layer 12 and oxide film 14 which are formed on the front surface side of the N type substrate 10 are removed, for example, in the same way as at the step shown in FIG. 6B, whereby the front surface side of the N type substrate 10 is flattened. Besides, in the same manner as in the third embodiment, the withstand voltage of the device portion is measured, and the N type substrate 10 is heat-treated when the withstand voltage deviates from its target value, whereby a charge balance is attained.

At the step shown in FIG. 7C, a P+ type layer 6 is formed at the front surface layer part of a P type layer 3. Besides, an N+ type layer 1 is formed in the same way as at the step shown in FIG. 2F. Thereafter, the unshown electrodes etc. of the device portion are formed, whereby the semiconductor device shown in FIG. 5 is finished up.

As described above, the super-junction structure may well be formed in such a way that, after the device portion has been formed on the N type substrate 10 earlier, the trench 11 is formed in the N type substrate 10, followed by the formations of the P type epitaxial layer 12 and the oxide film 13.

Fifth Embodiment

In this embodiment, only parts different from the parts of the foregoing embodiments will be described. This embodiment features that a low-concentration N− type substrate or an intrinsic semiconductor substrate is employed beforehand.

Figure 8:
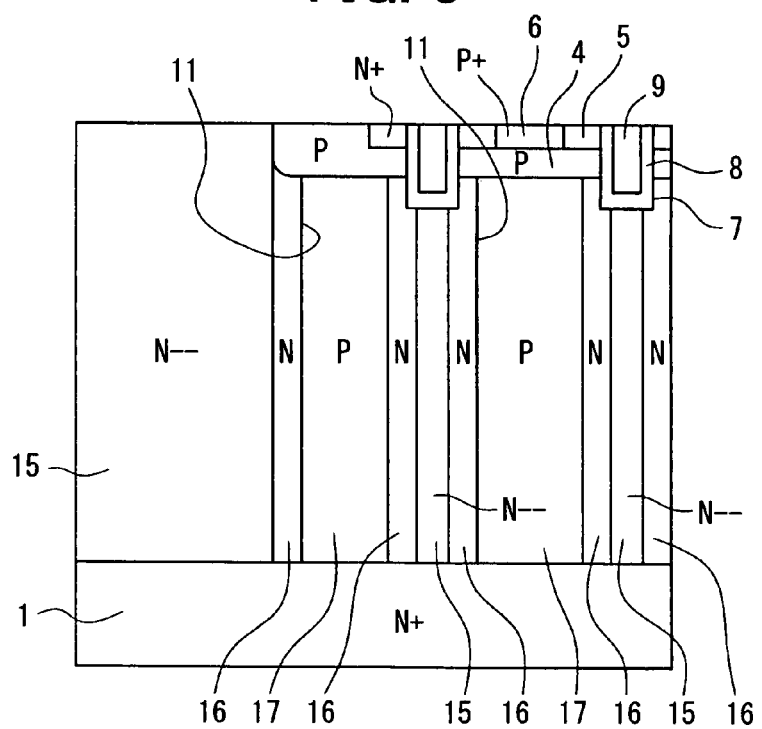
FIG. 8 is a cross sectional view showing a semiconductor device according to a fifth embodiment.

FIG. 8 is a schematic configurational view of a semiconductor device according to this embodiment. As shown in the figure, an N− type layer 15 (corresponding to a substrate of first conductivity type) is formed on an N+ type layer 1. The N− type layer 15 is arranged also at the outer edge part of the semiconductor device, and it fulfills the function of ensuring the withstand voltage of the terminal end part of a chip.

Besides, a plurality of trenches 11 are formed in the N− type layer 15, N type layers 16 are formed on the wall surfaces of the trenches 11, and P type layers 17 are formed so as to fill up the N type layers 16 within the trenches 11. That is, the N type layers 16 and the P type layers 17 are repeatedly arranged, whereby a super-junction structure is configured.

Besides, a device portion is formed at the front surface layer parts of the N– type layer 15, N type layers 16 and P type layers 17. Concretely, a P type channel layer 4 is formed at the front surface layer parts of the N– type layer 15, N type layers 16 and P type layers 17, and an N+ type source layer 5 is formed at the front surface layer part of the P type channel layer 4.

In addition, a trench 7 reaching the N type layers 16 and the N– type layer 15 is formed penetrating through the N+ type source layer 5 and the P type channel layer 4, and a gate insulating film 8 and a gate layer 9 are successively formed on the inner wall surface of the trench 7, whereby a trench gate structure which consists of the trench 7, gate insulating film 8 and gate layer 9 is configured.

Further, a P+ type layer 6 is formed on that part of the P type channel layer 4 which is formed on the P type layer 17. By the way, electrodes such as a gate electrode and a source electrode, wiring lines, an insulating film, etc. are formed on the trench gate structure in the same manner as in the foregoing embodiments. Besides, the N– type layer 15 is formed with a drain electrode not shown, so as to lie in touch with this N– type layer 15. The above is the whole configuration of the semiconductor device according to this embodiment.

Next, a method for manufacturing the semiconductor device will be described with reference to the drawings. FIGS. 9A to 9F are views showing manufacturing steps for the semiconductor device shown in FIG. 8.

At the step shown in FIG. 9A, a low-concentration N– type substrate 18 is prepared. More specifically, the low-concentration N– type substrate 18 is a silicon substrate which is doped with As, Sb or P as an impurity at a concentration of at most $1 \times 10^{15}$ cm$^{-3}$. Incidentally, an intrinsic semiconductor substrate may well be employed. Besides, at the step shown in FIG. 9B, trenches 11 are formed in the same way as at the step shown in FIG. 2B.

At the step shown in FIG. 9C, the side surfaces and bottom parts of the trenches 11 are doped with phosphine, arsine or antimony by vapor phase diffusion or ion implantation, thereby to form an N type layer 16.

Further, a CVD equipment is prepared, and the N– type substrate 18 formed with the N type layer 16 is set in the CVD equipment. Besides, a dopant gas of diborane, and HCL gas for suppressing an epitaxial growth at the upper parts of the trenches 11, are caused to flow through a growth gas of silane, dichlorosilane or trichlorosilane, whereby a P type epitaxial layer 12 is buried in the N type layer 16.

At the step shown in FIG. 9D, the front surface side of the N– type substrate 18 is flattened in the same way as at the step shown in FIG. 2D. Thus, the repeated parts of P type regions (the P type epitaxial layer 12) and N type regions (the N type layer 16) are denuded on the front surface side of the N– type substrate 18.

At the step shown in FIG. 9E, a device portion is formed by the same method as at the step shown in FIG. 2E. When the device portion has been thus formed, the P type epitaxial layers 12 within the trenches 11 are configured as the P type layers 17 shown in FIG. 8.

At the step shown in FIG. 9F, an N+ type layer 1 is formed in the same way as at the step shown in FIG. 2F. On this occasion, the N type layers 16 formed at the bottom surfaces of the trenches 11 are also made the N+ type layer 1. Thereafter, the electrodes etc. of the device portion are formed in the same manner as in the foregoing embodiments, whereby the semiconductor device shown in FIG. 8 is finished up.

As described above, this embodiment features that, in consideration of the withstand voltage of the terminal end part of the semiconductor device configured as a chip, the semiconductor device is manufactured by employing the low-concentration N– type substrate 18 (or an intrinsic semiconductor substrate) beforehand. Besides, the trenches 11 are formed in the N– type substrate 18, and the super-junction structure is configured within the trenches 11. Thus, in manufacturing the semiconductor device, the substrate need not be formed with a layer to become part of the super-junction structure, as an epitaxial layer, and it is possible to diminish the number of manufacturing steps and to curtail the manufacturing cost of the semiconductor device.

Besides, since the N type layer 16 is formed on the side surfaces and bottom parts of the trenches 11 by the vapor phase diffusion or the ion implantation, the width of the N type layer 16 can be made small, and the ON-resistance of the device portion can be lowered.

Further, in this embodiment, the low-concentration N– type substrate 18 is employed beforehand, and hence, the chip-like semiconductor device in which the withstand voltage of the terminal end part is considered can be manufactured.

Sixth Embodiment

In this embodiment, only parts different from the parts of the foregoing embodiments will be described. This embodiment features that the third embodiment and the fifth embodiment are combined.

Figure 10:
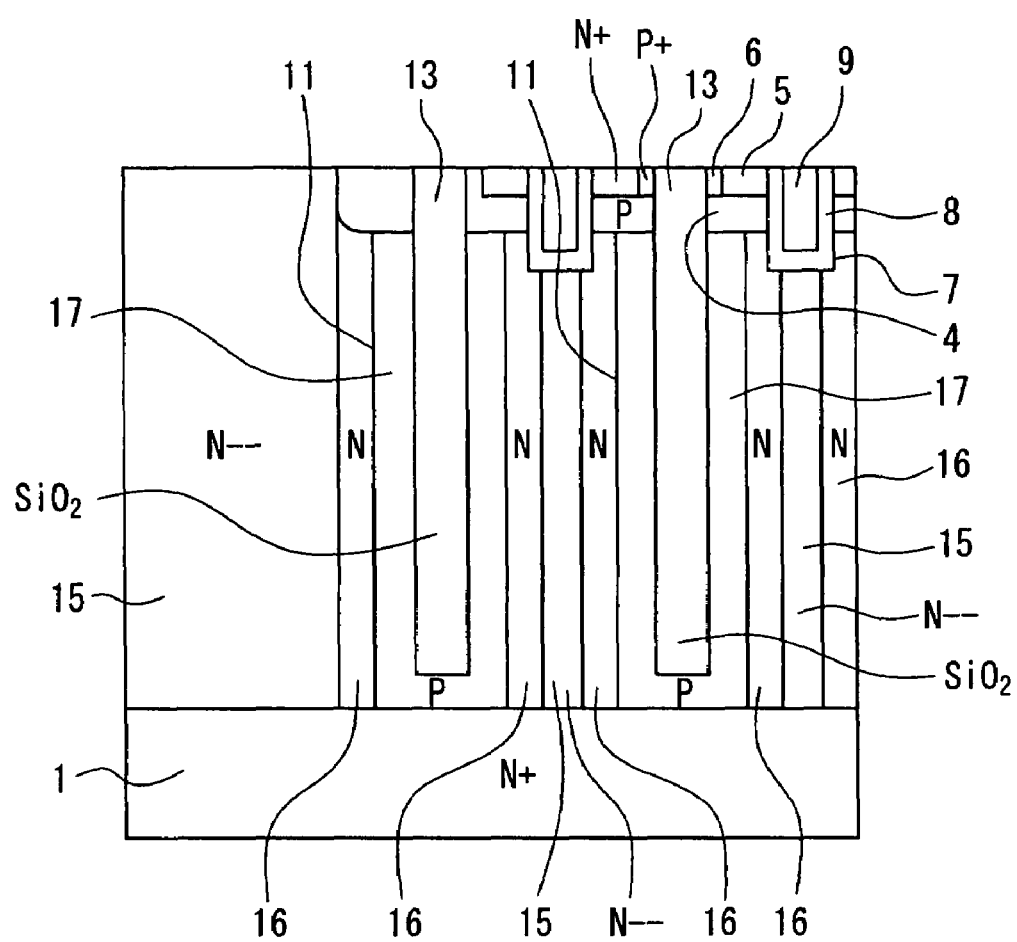
FIG. 10 is a cross sectional view showing a semiconductor device according to a sixth embodiment.

FIG. 10 is a schematic sectional view of a semiconductor device according to this embodiment. As shown in the figure, in this embodiment, N type layers 16 are formed on the wall surfaces of trenches 11. In addition, P type layers 17 are formed on the wall surfaces of the N type layers 16, and oxide films 13 are formed within the P type layers 17.

Next, a method for manufacturing the semiconductor device will be described with reference to the drawings. FIGS. 11A to 11D are views showing manufacturing steps for the semiconductor device shown in FIG. 10. First, the steps shown in FIGS. 9A and 9B are performed, thereby to prepare an N– type substrate 18 formed with trenches 11.

Figure 11A:
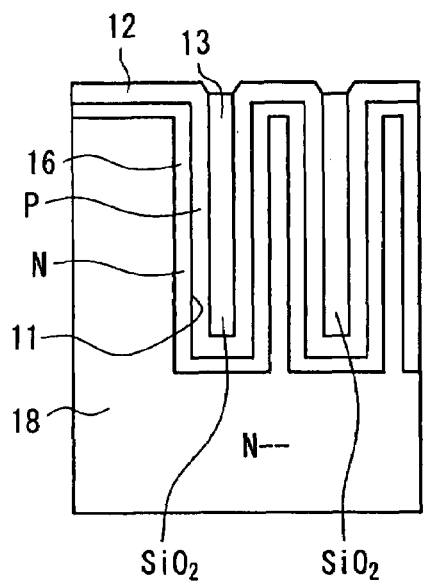
FIGS. 11A to 11D are cross sectional views showing a method for manufacturing the device shown in FIG. 10.

At the step shown in FIG. 11A, the side surfaces and bottom parts of the trenches 11 are doped with phosphine, arsine or antimony by vapor phase diffusion or ion implantation, thereby to form an N type layer 16.

Besides, a CVD equipment is prepared, and the N– type substrate 18 formed with the N type layer 16 is set in the CVD equipment. In addition, a dopant gas of diborane is caused to flow through a growth gas of silane, dichlorosilane or trichlorosilane, whereby a P type epitaxial layer 12 is formed on the wall surface of the N type layer 16 so that the N type layer 16 may not be completely filled up. Further, oxide films 13 are buried into the P type epitaxial layer 12 by employing the CVD equipment.

Figure 11B:
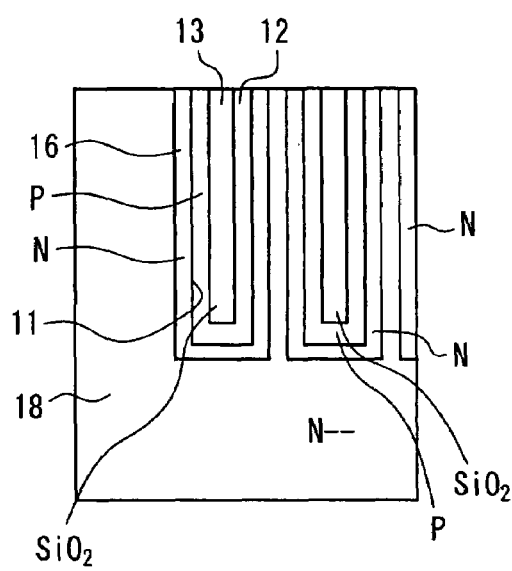

At the step shown in FIG. 11B, among the N type layer 16, P type epitaxial layer 12 and oxide films 13 which are formed on the front surface of the N– type substrate 18, the oxide films 13 are first removed by dry etching, and the P type epitaxial layer 12 and N type layer 16 are further flattened by dry etching or polishing based on CMP. Thus, the repeated parts of P type regions (the P type epitaxial layer 12) and N type regions (the N type layer 16) are denuded on the front surface of the N– type substrate 18.

Figure 11C:
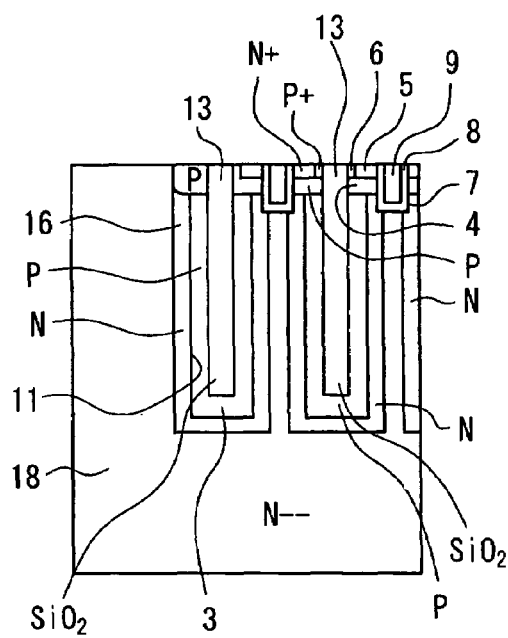

At the step shown in FIG. 11C, a device portion is formed in the same way as in FIG. 6C. In addition, the P type epitaxial layers 12 within the trenches 11 are configured as the P type layers 17 shown in FIG. 10.

Figure 11D:
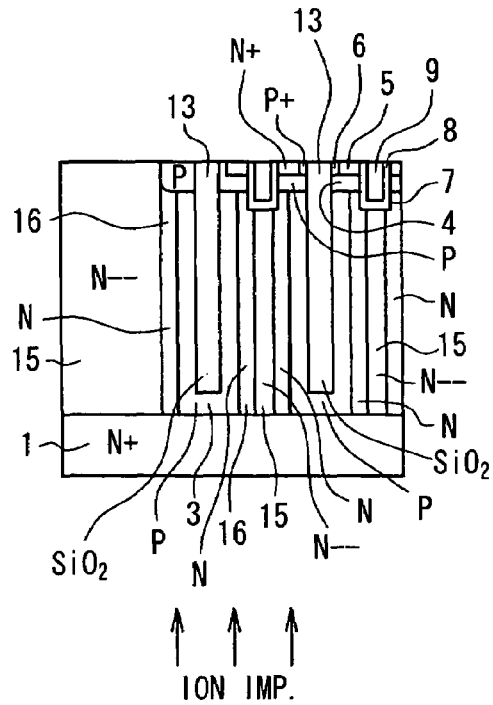

At the step shown in FIG. 11D, an N+ type layer 1 is formed in the same way as at the step shown in FIG. 9F. Thereafter, electrodes etc. not shown are formed as stated before, whereby the semiconductor device shown in FIG. 10 is finished up.

As described before, the P type layers 17 and the oxide films 13 may well be formed within the trenches 11 provided in the N− type substrate 18.

Seventh Embodiment

In this embodiment, only parts different from the parts of the foregoing embodiments will be described. This embodiment features that the MOS transistor of N-channel type shown in each of the foregoing embodiments, and a MOS transistor of P-channel type are formed in a single chip.

Figure 12:
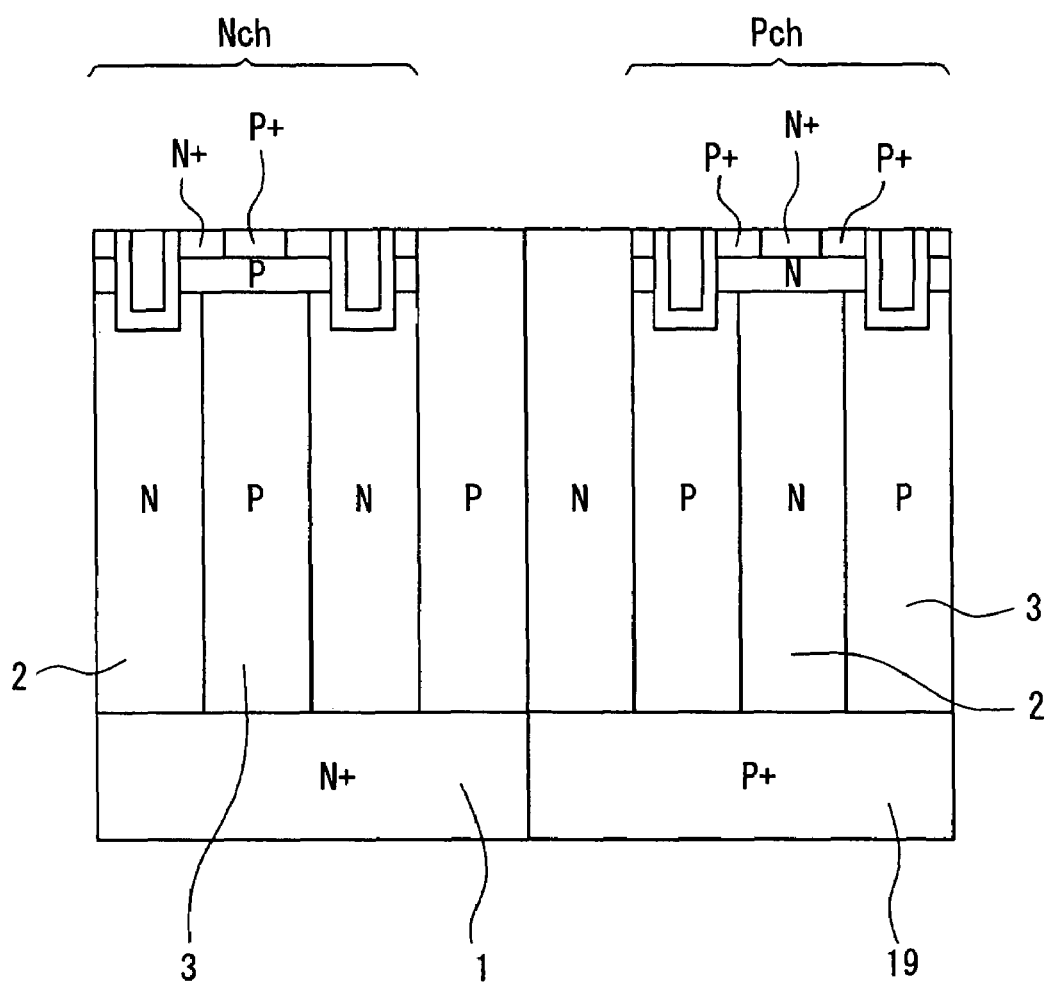
FIG. 12 is a cross sectional view showing a semiconductor device according to a seventh embodiment.

FIG. 12 is a schematic sectional view of a semiconductor device according to this embodiment. As shown in the figure, the semiconductor device is formed with a super-junction structure in which N type layers 2 and P type layers 3 are repeatedly arranged. Besides, the semiconductor device shown in FIG. 12 is formed with the MOS transistor of the N-channel type and the MOS transistor of the P-channel type.

In the semiconductor device, in a region where the N-channel type MOS transistor is formed, a trench gate structure is formed in an N type region, and an N+ type layer 1 is formed on the side of a substrate remote from the trench gate structure. Besides, in the semiconductor device, in a region where the P-channel type MOS transistor is formed, a trench gate structure is formed in a P type region, and a P+ type layer 19 (corresponding to a second layer of second conductivity type) is formed on the side of the substrate remote from the trench gate structure.

In this embodiment, the N+ type layer 1 and the P+ type layer 19 can be selectively formed on the rear surface side of the substrate by well-known photolithographic processes, etc. By the way, in case of forming the P+ type layer 19, boron is diffused by ion implantation.

As described above, in the semiconductor device having the super-junction structure in which the N type layers 2 and the P type layers 3 are repeatedly arranged, the respective MOS transistors of the N-channel type and the P-channel type can be formed.

Other Embodiments

In each of the first to sixth embodiments, there has been described the semiconductor device including the MOS transistor of N-channel type as the device portion. However, a semiconductor device including a MOS transistor of P-channel type as a device portion can also be manufactured by forming a trench gate structure in the P type layer 3.

Besides, in each of the first to sixth embodiments, the N type substrate 10 has been employed in manufacturing the semiconductor device, but a semiconductor device may well be manufactured by employing a P type substrate. That is, in each of the first to sixth embodiments, the semiconductor device can have the conductivity types of N and P types replaced with each other. By way of example, in each of the first to fourth embodiments, a P type substrate is prepared instead of the N type substrate 10, or in each of the fifth and sixth embodiments, a P− type substrate is prepared instead of the N− type substrate 18, whereupon a semiconductor device is manufactured on the corresponding substrate.

In the first embodiment, the semiconductor device shown in FIG. 1 has the structure in which the P type layer 3 and the N type layer 2 are formed on the N+ type layer 1. However, a quantity in which the N type substrate 10 is cut down at the step shown in FIG. 2F may well be adjusted, thereby to configure a structure in which the N type layer 2 is held between the N+ type layer 1 and the P type layer 3.

In the third embodiment, the semiconductor device shown in FIG. 5 has the structure in which the oxide film 13 is formed between the N+ type layer 1 and the P type layer 3. However, a quantity in which the N type substrate 10 is cut down at the step shown in FIG. 6D may well be adjusted, thereby to configure a structure in which the P type layer 3 is formed on the N+ type layer 1.

In the third embodiment, the P type epitaxial layer 12 has been formed by the CVD equipment at the step shown in FIG. 6C. However, instead of the formation of the P type epitaxial layer 12, the side wall of the trench 11 can be subjected to doping by vapor phase diffusion or ion implantation, whereby a P type layer corresponding to the P type epitaxial layer 12 is formed so as to bury the oxide film 13 within the P type layer.

Besides, in each of the third and fourth embodiments, the P type layer 3 has been formed by the epitaxial growth on the wall surface of the trench 11 of the N type substrate 10, but the P type layer 3 may well be formed by vapor phase diffusion or ion implantation from the side wall of the trench 11. Also in this case, in order to absorb out the impurity ions of the P type layer 3 into the oxide film 13 after the formation of the device portion and to attain the charge balance, the P type layer 3 should preferably be formed in the case of the vapor phase diffusion or the ion implantation so that the impurity concentration of the P type layer 3 formed within the trench 11 may become higher than the impurity concentration of the N type substrate 10.

In each of the fifth and sixth embodiments, a super-junction structure can also be formed in such a way that, in the same manner as in each of the second and fourth embodiments, the N type layer 16 and the P type layer 3 are formed by forming the trench 11 after the device portion has been formed on the N− type substrate 18 earlier. Besides, the N type layer 2 has been formed on the wall surface of the trench 11 of the N− type substrate 18 by the method of the vapor phase diffusion or the ion implantation, but an N type layer 2 may well be formed by epitaxially growing the N type layer 2 within the trench 11.

In the seventh embodiment, there has been described the semiconductor device in which the MOS transistors of N-channel type and P-channel type are formed in the single chip. It is also allowed, however, to employ a configuration in which the semiconductor device is formed with the oxide film 13 shown in, for example, the third embodiment. Besides, in the case where the MOS transistors of the N-channel type and the P-channel type are formed in the single chip, an N type layer 2 may well be included in consideration of the withstand voltage of the terminal end part of the chip as in the fifth or sixth embodiment. In this case, as stated before, the repeated structure is formed by forming the trenches in the N− type substrate 18, and the MOS transistors of the N-channel type and the P-channel type are respectively formed as in the seventh embodiment.

The above disclosure has the following features.

According to the first feature, in manufacturing a semiconductor device which has a super-junction structure wherein a region of first conductivity type (for example, N type) (a first layer (2) of the first conductivity type) and a region of second conductivity type (for example, P type) (a first layer (3) of the second conductivity type) are repeatedly arranged, a substrate (10) of the first conductivity type to become the first layer (2) of the first conductivity type as a drift region at a later step is first prepared, and a trench (11) is formed on the front surface side of the substrate (10) of the first conductivity type. In addition, the first layer (3) of the second conductivity type is formed within the trench (11). Thus, a region held between the first layers (3) of the second conductivity type, within the substrate (10) of the first conductivity type, is used as the first layer (2) of the first conductivity type, thereby to form a structure in which the first layer (2) of the first conductivity type and the first layer (3) of the second conductivity type are repeatedly arranged. Thereafter, the rear surface side of the substrate (10) of the first conductivity type formed with the repeated structure is thinned, thereby to form a second layer (1) of the first conductivity type on the rear surface side.

In this manner, the substrate (10) of the first conductivity type to configure the first layer (2) of the first conductivity type constituting the repeated structure is prepared, and the repeated structure is formed by employing the substrate (10) of the first conductivity type. Thus, it is possible to omit, for example, the step of preparing a support substrate configured as the second layer (1) of the first conductivity type and epitaxially growing the first layer (2) of the first conductivity type for the repeated structure, on the support substrate, and it is possible to relieve a manufacturing process and to curtail a manufacturing cost. Owing to the relief of the manufacturing process, the semiconductor device can be manufactured in a short time.

Besides, as stated above, the substrate (10) of the first conductivity type is employed without employing the base substrate which is configured as the second layer (1) of the first conductivity type and which has an impurity concentration higher than that of the substrate (10) of the first conductivity type. Therefore, in forming the first layer (3) of the second conductivity type within the trench (11), it is possible to suppress an outward diffusion in which an impurity migrates from the substrate (10) of the first conductivity type into the first layer (3) of the second conductivity type, and the impurity concentration of the first layer (3) of the second conductivity type can be prevented from deviating from a target value.

As the second feature, in the case of manufacturing the semiconductor device as stated above, it is possible to manufacture a semiconductor device in which the first layer (2) of the first conductivity type and the first layer (3) of the second conductivity type that are drift regions form the repeated structure, and which includes an N-channel type semiconductor element of vertical type that uses the first layer (2) of the first conductivity type as its drift region, and a P-channel type semiconductor element of vertical type that uses the first layer (3) of the second conductivity type as its drift region.

Even in the case where, in this manner, the single semiconductor device in which the semiconductor elements of N-channel and P-channel are formed is to be manufactured, the semiconductor device can be manufactured by preparing the substrate (10) of the first conductivity type to become the first layer (2) of the first conductivity type being the drift region, as stated above.

Besides, in preparing the substrate (10) of the first conductivity type, the impurity concentration of the substrate (10) of the first conductivity type is measured, and at the step of forming the first layer (3) of the second conductivity type, the first layer (3) of the second conductivity type is formed so that the product between the impurity concentration of the substrate (10) of the first conductivity type measured beforehand and the width of the layer of the first conductivity type (N type) between the first layers (3) of the second conductivity type may become equal to the product between the width of the first layer (3) of the second conductivity type between the first layers (2) of the first conductivity type and the impurity concentration of the first layer (3) of the second conductivity type, in other words, that a charge balance may be attained.

In this manner, the concentration and trench width of the substrate (10) of the first conductivity type are measured beforehand, and in forming the first layer (3) of the second conductivity type, this first layer (3) of the second conductivity type can be formed while the charge balance is being adjusted. Thus, the withstand voltages of the semiconductor elements can be enhanced.

Further, in forming the first layer (3) of the second conductivity type, this first layer (3) of the second conductivity type can be formed without lowering the temperature of the substrate (10) of the first conductivity type stepwise. Thus, the outward diffusion of impurity ions from the substrate (10) of the first conductivity type into the first layer (3) of the second conductivity type can be prevented from occurring.

Besides, after the repeated structure has been formed, the N-channel type semiconductor element of the vertical type can be formed at the front surface layer part of the first layer (2) of the first conductivity type constituting the repeated structure.

To the contrary, after the substrate (10) of the first conductivity type has been prepared, the N-channel type semiconductor element of the vertical type is formed at the front surface layer part of the substrate (10) of the first conductivity type, whereupon at the later step of forming the trenches (11), the trenches (11) can be formed between the N-channel type semiconductor elements of the vertical type in the substrate (10) of the first conductivity type.

As the third feature, a substrate (10) of first conductivity type is prepared, and a trench (11) is formed on the front surface side of the substrate (10) of the first conductivity type, whereupon a first layer (3) of second conductivity type is epitaxially grown on the inner wall surface of the trench (11) to a thickness of, at most, half of the width of the trench (11). In addition, an oxide film (13) is formed on the first layer (3) of the second conductivity type epitaxially grown, and the trench (11) is filled up with the oxide film (13), whereby a region held between the first layers (3) of the second conductivity type, in the substrate (10) of the first conductivity type, is used as a first layer (2) of the first conductivity type, and a repeated structure in which the first layer (2) of the first conductivity type and the first layer (3) of the second conductivity type are alternately arranged is formed.

In this manner, the first layer (3) of the second conductivity type is epitaxially grown within the trench (11), whereby the width of the first layer (3) of the second conductivity type can be made small, and in turn, an ON-resistance in the first layer (3) of the second conductivity type can be lowered.

Besides, as the fourth feature, regarding the third feature, in forming the first layer (3) of the second conductivity type, the inner wall surface of the trench (11) provided in the substrate (10) of the first conductivity type is subjected to vapor phase diffusion or to ion implantation, whereby the wall surface of the trench (11) is formed into the first layer (3) of the second conductivity type.

In this manner, the first layer (3) of the second conductivity type is not formed within the trench (11), but the wall surface of the trench (11) can be formed as the first layer (3) of the second conductivity type.

In case of forming a semiconductor element, the repeated structure is formed, and the N-channel type semiconductor element of vertical type can be thereafter formed at the front surface layer part of a first layer (2) of first conductivity type constituting the repeated structure.

To the contrary, after a substrate (10) of the first conductivity type has been prepared, the N-channel type semiconductor element of the vertical type is formed at the front surface layer part of the substrate (10) of the first conductivity type, whereupon a trench (11) can be formed between the N-channel type semiconductor elements of the vertical type.

Besides, in preparing the substrate (10) of the first conductivity type, the impurity concentration of the substrate (10) of the first conductivity type is measured beforehand. In addition, after the N-channel type semiconductor element of the vertical type has been formed on the substrate (10) of the first conductivity type, the withstand voltage of the N-channel type semiconductor element of the vertical type is measured. Thereafter, in a case where the measured withstand voltage is lower than a reference value, the substrate (10) of the first conductivity type is heat-treated so that the product between the impurity concentration of the substrate (10) of the first conductivity type and the width of the first layer (2) of the first conductivity type between first layers (3) of second conductivity type may become equal to the product between the width of the first layer (3) of the second conductivity type between the first layers (2) of the first conductivity type and the impurity concentration of the first layer (3) of the second conductivity type. In this way, impurity ions contained in the first layer (3) of the second conductivity type can be absorbed out from this first layer (3) of the second conductivity type into an oxide film (13).

Thus, the charge balance between the first layer (2) of the first conductivity type and the first layer (3) of the second conductivity type can be attained, and the withstand voltage of the semiconductor element can be enhanced.

In the case of absorbing out the impurity ions of the first layer (3) of the second conductivity type into the oxide film (13) as stated above, in forming the first layer (3) of the second conductivity type, this first layer (3) of the second conductivity type should preferably be formed so that the impurity concentration of the first layer (3) of the second conductivity type may become higher than the impurity concentration of the substrate (10) of the first conductivity type.

That is, in the case where the impurity ions of the first layer (3) of the second conductivity type are absorbed out into the oxide film (13) by heat-treating the substrate (10) of the first conductivity type, thereby to attain the charge balance between the first layer (2) of the first conductivity type and the first layer (3) of the second conductivity type, the impurity ions are swept out from the first layer (3) of the second conductivity type. Therefore, the impurity concentration of the first layer (3) of the second conductivity type is set higher beforehand, whereby the adjustment of the charge balance in the case of heat-treating the substrate (10) of the first conductivity type can be performed with ease.

Besides, in the case of adjusting the charge balance, in forming the first layer (3) of the second conductivity type, this first layer (3) of the second conductivity type should preferably be formed so that the product between the width of the first layer (3) of the second conductivity type between the first layers (2) of the first conductivity type and the impurity concentration of the first layer (3) of the second conductivity type may become larger than the product between the impurity concentration of the substrate (10) of the first conductivity type and the width of the first layer (2) of the first conductivity type between the first layers (3) of the second conductivity type.

The first layer (3) of the second conductivity type is formed so as to satisfy such a condition, whereby the adjustment of the charge balance in the case of heat-treating the substrate (10) of the first conductivity type can be easily performed as in the above.

In preparing the substrate (10) of the first conductivity type, a substrate which is doped with phosphorus, arsenic or antimony as an impurity should preferably be prepared as the substrate (10) of the first conductivity type.

Besides, in preparing the substrate (10) of the first conductivity type, a substrate whose impurity concentration is at least $1 \times 10^{15}$ cm$^{-3}$ and at most $1 \times 10^{18}$ cm$^{-3}$ should preferably be prepared as the substrate (10) of the first conductivity type. That is, it is desirable to set the lower limit of a doping quantity at $1 \times 10^{15}$ cm$^{-3}$ for the purpose of obtaining the substrate doped with the impurity, and to set the upper limit of the doping quantity at $1 \times 10^{18}$ cm$^{-3}$ for the purpose of avoiding a situation where any depletion layer is not formed.

As the fifth feature, a substrate (18) of first conductivity type which is lower in impurity concentration than a first layer (2) of the first conductivity type is prepared, and trenches (11) are formed on the front surface side of the substrate (18) of the first conductivity type. In addition, inner wall surfaces of the trenches (11) are subjected to vapor phase diffusion or ion implantation, whereby the wall surfaces of the trenches (11) are formed into the first layer (2) of the first conductivity type. Thereafter, a first layer (3) of second conductivity type is formed on the first layer (2) of the first conductivity type, thereby to form a structure in which the first layer (2) of the first conductivity type and the first layer (3) of the second conductivity type are repeatedly arranged. The rear surface side of the substrate (18) of the first conductivity type formed with the repeated structure is thinned, thereby to form a second layer (1) of the first conductivity type on the rear surface side.

In this manner, in manufacturing a semiconductor device, the substrate (18) of the first conductivity type is first prepared. Thus, as stated before, epitaxial films for the repeated structure need not be formed beforehand. Besides, owing to the use of the substrate (18) of the first conductivity type, the semiconductor device in which the terminal end part of a chip is considered can be manufactured.

As the sixth feature, regarding the fifth feature, the first layer (2) of the first conductivity type is epitaxially grown on the inner wall surfaces of the trenches (11) formed on the front surface side of the substrate (18) of the first conductivity type, and the first layer (3) of the second conductivity type is epitaxially grown on the first layer (2) of the first conductivity type.

In this manner, the first layer (2) of the first conductivity type and the first layer (3) of the second conductivity type may well be respectively formed by the epitaxial growths. Thus, the widths of the first layer (2) of the first conductivity type and the first layer (3) of the second conductivity type can be made small, and ion resistances in the respective layers can be lowered.

As the seventh feature, regarding the fifth feature, oxide films (13) are formed on the first layer (3) of the second conductivity type, thereby to fill up the trenches (11) with the oxide films (13). In this manner, the structure in which the trenches (11) are filled up with the oxide films (13) can also be formed.

In the case of manufacturing the semiconductor device by employing the substrate (18) of the first conductivity type as stated above, the substrate (18) of the first conductivity type is prepared, and N-channel type semiconductor elements of vertical type are thereafter formed at the front surface layer part of the substrate (18) of the first conductivity type, whereupon the trench (11) can be formed between the N-channel type semiconductor elements of the vertical type, in the substrate (18) of the first conductivity type.

In the case of manufacturing the semiconductor device by employing the substrate (18) of the first conductivity type, before a second layer (1) of the first conductivity type is formed on the rear surface side of the substrate (18), the N-channel type semiconductor element of the vertical type can also be formed at the front surface layer parts of the first layer (2) of the first conductivity type constituting the repeated structure and a third layer (15) of the first conductivity type held between the first layers (2) of the first conductivity type.

Incidentally, the bracketed numerals of the various means indicate corresponding relations with concrete means which will be stated in embodiments to be described later.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a semiconductor device comprising:
    forming a plurality of trenches on a first side of a semiconductor substrate, wherein the substrate has a first conductive type;
    forming a second conductive type semiconductor film in each trench so that the substrate between two adjacent trenches provides a first column, and the second conductive type semiconductor film in each trench provides a second column, wherein the first and second columns are alternately repeated along with a predetermined direction in parallel to the first side of the substrate;
    thinning a second side of the substrate, the second side being opposite to the first side; and
    increasing an impurity concentration of the first conductive type in a thinned second side of the substrate so that a first conductive type layer is provided, wherein
    the impurity concentration of the first conductive type layer is higher than an impurity concentration of the first column, and
    the first column provides a drift layer so that a vertical type first-conductive-type channel transistor is formed.

2. The method according to claim 1, wherein
    the first conductive type is a N conductive type, and the second conductive type is a P conductive type, and
    the vertical type first-conductive-type channel transistor is a vertical type N channel transistor.

3. The method according to claim 2, further comprising:
    forming the vertical type N channel transistor in a surface portion of the first column after the forming the second conductive type semiconductor film.

4. The method according to claim 2, further comprising:
    forming a plurality of vertical type N channel transistors in a surface portion of the substrate before the forming the plurality of trenches, wherein
    the surface portion is to be the first column, and
    in the forming the plurality of trenches, each trench is disposed between two adjacent vertical type N channel transistors.

5. The method according to claim 1, wherein
    the forming the plurality of trenches includes:
        measuring an impurity concentration of the substrate; and
        measuring a width of each trench and a width between two adjacent trenches, and
    in the forming the second conductive type semiconductor film, an impurity concentration of the second conductive type semiconductor film is controlled in such a manner that a product of the impurity concentration of the substrate and the width between two adjacent trenches is equalized to a product of the impurity concentration of the second conductive type semiconductor film and the width of the trench.

6. The method according to claim 1, wherein
    in the forming the second conductive type semiconductor film, a temperature of the substrate is maintained to be a predetermined temperature.

7. The method according to claim 1, wherein
    the substrate includes a dopant of phosphorous, arsenic or antimony.

8. The method according to claim 1, wherein
    the substrate has an impurity concentration in a range between $1\times10^{15}$ cm$^{-3}$ and $1\times10^{18}$ cm$^{-3}$.

9. A method for manufacturing a semiconductor device comprising:
    forming a plurality of trenches on a first side of a semiconductor substrate, wherein the substrate has a first conductive type;
    forming a second conductive type semiconductor film in each trench so that the substrate between two trenches provides a first column, and the second conductive type semiconductor film in each trench provides a second column, wherein the first and second columns are alternately repeated along with a predetermined direction in parallel to the first side of the substrate;
    thinning a second side of the substrate, the second side being opposite to the first side;
    increasing an impurity concentration of a first part of a thinned second side of the substrate so that the first part provides a first conductive type layer; and
    reforming a second part of the thinned second side of the substrate so that the second part provides a second conductive type layer, wherein
    the first part of the thinned second side is adjacent to the second part of the thinned second side,
    the impurity concentration of the first conductive type layer is higher than an impurity concentration of the first column,
    the impurity concentration of the second conductive type layer is higher than an impurity concentration of the second column,
    the first column on the first part of the thinned second side provides a drift layer so that a vertical type first-conductive-type channel transistor is formed, and
    the second column on the second part of the thinned second side provides a drift layer so that a vertical type second-conductive-type channel transistor is formed.

10. The method according to claim 9, wherein
    the first conductive type is a N conductive type, and the second conductive type is a P conductive type,
    the vertical type first-conductive-type channel transistor is a vertical type N channel transistor, and
    the vertical type second-conductive-type channel transistor is a vertical type P channel transistor.

11. The method according to claim 10, further comprising:
forming the vertical type N channel transistor in a surface portion of the first column after the forming the second conductive type semiconductor film.

12. The method according to claim 10, further comprising:
forming a plurality of vertical type N channel transistors in a surface portion of the substrate before the forming the plurality of trenches, wherein
the surface portion is to be the first column, and
in the forming the plurality of trenches, each trench is disposed between two adjacent vertical type N channel transistors.

13. The method according to claim 9, wherein
the forming the plurality of trenches includes:
measuring an impurity concentration of the substrate; and
measuring a width of each trench and a width between two adjacent trenches, and
in the forming the second conductive type semiconductor film, an impurity concentration of the second conductive type semiconductor film is controlled in such a manner that a product of the impurity concentration of the substrate and the width between two adjacent trenches is equalized to a product of the impurity concentration of the second conductive type semiconductor film and the width of the trench.

14. The method according to claim 9, wherein
in the forming the second conductive type semiconductor film, a temperature of the substrate is maintained to be a predetermined temperature.

15. The method according to claim 9, wherein
the substrate includes a dopant of phosphorous, arsenic or antimony.

16. The method according to claim 9, wherein
the substrate has an impurity concentration in a range between $1 \times 10^{15}$ cm$^{-3}$ and $1 \times 10^{18}$ cm$^{-3}$.

17. A method for manufacturing a semiconductor device comprising:
forming a plurality of trenches on a first side of a semiconductor substrate, wherein the substrate has a first conductive type;
forming a second conductive type semiconductor film on an inner wall of each trench by an epitaxial growth method in such a manner that a thickness of the second conductive film is equal to or smaller than a half of a width of the trench;
forming an oxide film on the second conductive type semiconductor film in each trench so that the trench is filled with the oxide film, wherein the substrate between two trenches provides a first column, and the second conductive type semiconductor film in each trench provides a second column, and wherein the first and second columns are alternately repeated along with a predetermined direction in parallel to the first side of the substrate;
thinning a second side of the substrate, the second side being opposite to the first side; and
increasing an impurity concentration of a thinned second side of the substrate so that a first conductive type layer is provided, wherein
an impurity concentration of the first conductive type layer is higher than an impurity concentration of the first column, and
the first column provides a drift layer so that a vertical type first-conductive-type channel transistor is formed.

18. The method according to claim 17, wherein
the first conductive type is a N conductive type, and the second conductive type is a P conductive type, and
the vertical type first-conductive-type channel transistor is a vertical type N channel transistor.

19. The method according to claim 18, further comprising:
forming the vertical type N channel transistor in a surface portion of the first column after the forming the oxide film.

20. The method according to claim 19, wherein
the forming the plurality of trenches includes measuring an impurity concentration of the substrate;
the forming the vertical type N channel transistor includes measuring a breakdown voltage of the vertical type N channel transistor,
the measuring the breakdown voltage includes heating the substrate in order to move an impurity ion from the second column into the oxide film when the breakdown voltage is smaller than a predetermined voltage, and
the heating the substrate is performed in such a manner that a product of the impurity concentration of the substrate and a width between two adjacent trenches is equalized to a product of the impurity concentration of the second conductive type semiconductor film and a width of the trench.

21. The method according to claim 20, wherein
in the forming the second conductive type semiconductor film, the impurity concentration of the second conductive type semiconductor film is higher than the impurity concentration of the substrate.

22. The method according to claim 20, wherein
in the forming the second conductive type semiconductor film, the product of the impurity concentration of the second conductive type semiconductor film and a thickness of the second conductive type semiconductor film is larger than the product of the impurity concentration of the substrate and the width between two adjacent trenches.

23. The method according to claim 18, further comprising:
forming a plurality of vertical type N channel transistors in a surface portion of the substrate before the forming the plurality of trenches, wherein
the surface portion is to be the first column, and
in the forming the plurality of trenches, each trench is disposed between two adjacent vertical type N channel transistors.

24. The method according to claim 17, wherein
the substrate includes a dopant of phosphorous, arsenic or antimony.

25. The method according to claim 17, wherein
the substrate has an impurity concentration in a range between $1 \times 10^{15}$ cm$^{-3}$ and $1 \times 10^{18}$ cm$^{-3}$.

26. A method for manufacturing a semiconductor device comprising:
forming a plurality of trenches on a first side of a semiconductor substrate, wherein the substrate has a first conductive type;
forming a second conductive type semiconductor region on an inner wall of each trench by diffusing atoms in vapor phase or implanting ions into the inner wall of the trench;
forming an oxide film on the second conductive type semiconductor region in each trench so that the trench is filled with the oxide film, wherein the substrate between two trenches provides a first column, and the second conductive type semiconductor region in each trench provides a second column, wherein the first and second columns are alternately repeated along with a predetermined direction in parallel to the first side of the substrate;

thinning a second side of the substrate, the second side being opposite to the first side; and increasing an impurity concentration of a thinned second side of the substrate so that a first conductive type layer is provided, wherein an impurity concentration of the first conductive type layer is higher than an impurity concentration of the first column, and the first column provides a drift layer so that a vertical type first-conductive-type channel transistor is formed.

27. The method according to claim 26, wherein
the first conductive type is a N conductive type, and the second conductive type is a P conductive type, and
the vertical type first-conductive-type channel transistor is a vertical type N channel transistor.

28. The method according to claim 27, further comprising:
forming the vertical type N channel transistor in a surface portion of the first column after the forming the oxide film.

29. The method according to claim 28, wherein
the forming the plurality of trenches includes measuring an impurity concentration of the substrate;
the forming the vertical type N channel transistor includes measuring a breakdown voltage of the vertical type N channel transistor,
the measuring the breakdown voltage includes heating the substrate in order to move an impurity ion from the second column into the oxide film when the breakdown voltage is smaller than a predetermined voltage, and
the heating the substrate is performed in such a manner that a product of the impurity concentration of the substrate and a width between two adjacent trenches is equalized to a product of the impurity concentration of the second conductive type semiconductor region and a width of the trench.

30. The method according to claim 29, wherein
in the forming the second conductive type semiconductor region, the impurity concentration of the second conductive type semiconductor region is higher than the impurity concentration of the substrate.

31. The method according to claim 29, wherein
in the forming the second conductive type semiconductor region, the product of the impurity concentration of the second conductive type semiconductor region and a thickness of the second conductive type semiconductor region is larger than the product of the impurity concentration of the substrate and the width between two adjacent trenches.

32. The method according to claim 27, further comprising:
forming a plurality of vertical type N channel transistors in a surface portion of the substrate before the forming the plurality of trenches, wherein
the surface portion is to be the first column, and
in the forming the plurality of trenches, each trench is disposed between two adjacent vertical type N channel transistors.

33. The method according to claim 26, wherein
the substrate includes a dopant of phosphorous, arsenic or antimony.

34. The method according to claim 26, wherein
the substrate has an impurity concentration in a range between $1 \times 10^{15}$ cm$^{-3}$ and $1 \times 10^{18}$ cm$^{-3}$.

35. A method for manufacturing a semiconductor device comprising:
forming a plurality of trenches on a first side of a semiconductor substrate, wherein the substrate has a first conductive type;
forming a first conductive type semiconductor region on an inner wall of each trench by diffusing atoms in vapor phase or implanting ions into the inner wall of the trench, wherein an impurity concentration of the first conductive type semiconductor region is higher than an impurity concentration of the substrate, and wherein the substrate between the first conductive type semiconductor region in adjacent two trenches and the first conductive type semiconductor region in the adjacent two trenches provide a first column;
forming a second conductive type semiconductor film on the first conductive type semiconductor region in each trench so that the second conductive type semiconductor film in each trench provides a second column, wherein the first and second columns are alternately repeated along with a predetermined direction in parallel to the first side of the substrate;
thinning a second side of the substrate, the second side being opposite to the first side; and
increasing an impurity concentration of a thinned second side of the substrate so that a first conductive type layer is provided, wherein the impurity concentration of the first conductive type layer is higher than an impurity concentration of the first conductive type semiconductor region, wherein
a part of the substrate disposed on a periphery of the substrate provides a periphery layer, and
the first column provides a drift layer so that a vertical type first-conductive-type channel transistor is formed.

36. The method according to claim 35, wherein
the first conductive type is a N conductive type, and the second conductive type is a P conductive type, and
the vertical type first-conductive-type channel transistor is a vertical type N channel transistor, the method further comprising:
forming a plurality of vertical type N channel transistors in a surface portion of the substrate before the forming the plurality of trenches, wherein
the surface portion is to be the first column, and
in the forming the plurality of trenches, each trench is disposed between two adjacent vertical type N channel transistors.

37. The method according to claim 35, wherein
the first conductive type is a N conductive type, and the second conductive type is a P conductive type, and
the vertical type first-conductive-type channel transistor is a vertical type N channel transistor, the method further comprising:
forming the vertical type N channel transistor in a surface portion of the first column after the forming the second conductive type semiconductor film and before the thinning the second side.

38. A method for manufacturing a semiconductor device comprising:
forming a plurality of trenches on a first side of a semiconductor substrate, wherein the substrate has a first conductive type;
forming a first conductive type semiconductor region on an inner wall of each trench by an epitaxial growth method, wherein an impurity concentration of the first conductive type semiconductor region is higher than an impurity concentration of the substrate, and wherein the substrate between adjacent two trenches and the first conductive type semiconductor region in the adjacent two trenches provide a first column;

forming a second conductive type semiconductor film on the first conductive type semiconductor region in each trench so that the second conductive type semiconductor film in each trench provides a second column, wherein the first and second columns are alternately repeated along with a predetermined direction in parallel to the first side of the substrate;

thinning a second side of the substrate, the second side being opposite to the first side; and increasing an impurity concentration of a thinned second side of the substrate so that a first conductive type layer is provided, wherein the impurity concentration of the first conductive type layer is higher than an impurity concentration of the first conductive type semiconductor region, wherein a part of the substrate disposed on a periphery of the substrate provides a periphery layer, and the first column provides a drift layer so that a vertical type first-conductive-type channel transistor is formed.

39. The method according to claim 38, wherein the first conductive type is a N conductive type, and the second conductive type is a P conductive type, and the vertical type first-conductive-type channel transistor is a vertical type N channel transistor, the method further comprising:

forming a plurality of vertical type N channel transistors in a surface portion of the substrate before the forming the plurality of trenches, wherein the surface portion is to be the first column, and in the forming the plurality of trenches, each trench is disposed between two adjacent vertical type N channel transistors.

40. The method according to claim 38, wherein the first conductive type is a N conductive type, and the second conductive type is a P conductive type, and the vertical type first-conductive-type channel transistor is a vertical type N channel transistor, the method further comprising:

forming the vertical type N channel transistor in a surface portion of the first column after the forming the second conductive type semiconductor film and before the thinning the second side.

41. A method for manufacturing a semiconductor device comprising:

forming a plurality of trenches on a first side of a semiconductor substrate, wherein the substrate has a first conductive type;

forming a first conductive type semiconductor region on an inner wall of each trench by diffusing atoms in vapor phase or implanting ions into the inner wall of the trench, wherein an impurity concentration of the first conductive type semiconductor region is higher than an impurity concentration of the substrate, and wherein the substrate between the first conductive type semiconductor region in adjacent two trenches and the first conductive type semiconductor region in the adjacent two trenches provide a first column;

forming a second conductive type semiconductor film on the first conductive type semiconductor region in each trench by an epitaxial growth method;

forming an oxide film on the second conductive type semiconductor film in each trench so that the trench is filled with the oxide film, wherein the second conductive type semiconductor film in each trench provides a second column, and wherein the first and second columns are alternately repeated along with a predetermined direction in parallel to the first side of the substrate;

thinning a second side of the substrate, the second side being opposite to the first side; and increasing an impurity concentration of a thinned second side of the substrate so that a first conductive type layer is provided, wherein the impurity concentration of the first conductive type layer is higher than an impurity concentration of the first conductive type semiconductor region, wherein a part of the substrate disposed on a periphery of the substrate provides a periphery layer, and the first column provides a drift layer so that a vertical type first-conductive-type channel transistor is formed.

42. The method according to claim 41, wherein the first conductive type is a N conductive type, and the second conductive type is a P conductive type, and the vertical type first-conductive-type channel transistor is a vertical type N channel transistor, the method further comprising:

forming a plurality of vertical type N channel transistors in a surface portion of the substrate before the forming the plurality of trenches, wherein the surface portion is to be the first column, and in the forming the plurality of trenches, each trench is disposed between two adjacent vertical type N channel transistors.

43. The method according to claim 41, wherein the first conductive type is a N conductive type, and the second conductive type is a P conductive type, and the vertical type first-conductive-type channel transistor is a vertical type N channel transistor, the method further comprising:

forming the vertical type N channel transistor in a surface portion of the first column after the forming the second conductive type semiconductor film and before the thinning the second side.

* * * * *